(12) United States Patent
Saeki

(10) Patent No.: US 7,054,404 B2
(45) Date of Patent: May 30, 2006

(54) CLOCK CONTROL METHOD, FREQUENCY DIVIDING CIRCUIT AND PLL CIRCUIT

(75) Inventor: Takanori Saeki, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 771 days.

(21) Appl. No.: 10/225,361

(22) Filed: Aug. 22, 2002

(65) Prior Publication Data
US 2003/0048863 A1 Mar. 13, 2003

(30) Foreign Application Priority Data
Sep. 10, 2001 (JP) ............................. 2001-273771

(51) Int. Cl.
*H03D 3/24* (2006.01)
(52) U.S. Cl. .................... 375/376; 375/374; 375/375; 331/25
(58) Field of Classification Search ............... 375/376, 375/375, 374, 373; 331/17, 25, 16, 18
See application file for complete search history.

(56) References Cited

U.S. PATENT DOCUMENTS 4,484,153 A * 11/1984 Borras et al. ................. 331/10
5,349,310 A * 9/1994 Rieder et al. ................. 331/18
5,889,437 A * 3/1999 Lee .............................. 331/16
6,066,990 A * 5/2000 Genest ......................... 331/25

FOREIGN PATENT DOCUMENTS

JP 6-69788 A 3/1994
JP 6-120815 A 4/1994

* cited by examiner

Primary Examiner—Phuong Phu
(74) Attorney, Agent, or Firm—Sughrue Mion, PLLC

(57) ABSTRACT

A PLL circuit includes a phase comparator; a charge pump; a loop filter; a voltage-controlled oscillator; a frequency dividing circuit; an A counter for dividing the P-frequency-divided output; circuits for generating two signals, which have a phase difference equivalent to one period of the P-frequency-divided output of the frequency dividing circuit; and an interpolator for producing an output signal obtained by interpolating the phase difference between the two signals in accordance with an interior division ratio. The interpolator interpolates in steps of a value obtained by dividing the phase difference by P and incrementing or decrementing a value B, which decides an interior division ratio B:P–B, by B whenever frequency-division by A is performed, and a control circuit. The phase of the output of the interpolator is fed to the phase comparator and compared with the phase of a reference clock, and divides by a frequency-dividing factor.

29 Claims, 15 Drawing Sheets

CLOCK CONTROL METHOD, FREQUENCY DIVIDING CIRCUIT AND PLL CIRCUIT

FIELD OF THE INVENTION

This invention relates to a frequency dividing circuit and to a phase-locked loop (PLL) equipped with the frequency dividing circuit. More particularly, the invention relates to a variable frequency dividing circuit that employs an interpolator, and to a PLL having this frequency dividing circuit.

BACKGROUND OF THE INVENTION

FIG. 14 is a diagram illustrating the structure of a conventional PLL equipped with a variable frequency divider has pulse-swallow architecture.

As shown in FIG. 14, the PLL comprises an amplifier 201 for amplifying the output (whose frequency ftcxo is 14.4 MHz) of an externally mounted temperature-compensated crystal oscillator (TCXO) 200; a reference-frequency dividing circuit 202 for frequency-dividing the output of the amplifier 201; a phase comparator 203 for sensing the phase difference between a reference signal (frequency f≈400 KHz), which is the result of frequency division by the reference-frequency dividing circuit 202, and a frequency-divided clock; a charge pump 204 for charging a capacitance (not shown) when the phase comparator 203 is outputting an UP signal in accordance with the result of the phase comparison and for discharging the charge, which has accumulated in the capacitance, when the phase comparator 203 is outputting a DOWN signal in accordance with the result of the phase comparison; a low-pass filter (loop filter) LPF 205 for smoothing the terminal voltage of the capacitance charged/discharged by the charge pump 204; a voltage-controlled oscillator (VCO) 206, to which the output voltage of the LPF 205 is input as a control voltage, for oscillating at a frequency conforming to the control voltage and outputting a signal having this frequency; a divide-by-P or divide-by-(P+1) frequency dividing circuit (referred to also as a "prescaler") 207 composed by ECL (emitter-coupled logic) circuits for frequency-dividing the output of the voltage-controlled oscillator 206 by P or (P+1); and an A counter 209 and B counter 210 for counting the output of the prescaler 207. The phase comparator 203 compares the phase of an (A×P+B)-divided signal, which is output from a control circuit 213, and the phase of the reference signal.

An MC (modulus control) signal supplied to the prescaler 207 from the B counter 210 is a control signal for changing the frequency-dividing factor of the P, (P+1) frequency dividing prescaler 207. The prescaler 207 functions as a divide-by-P prescaler when the signal MC is at HIGH level and as a divide-by-(P+1) prescaler when the signal MC is at LOW level.

A modulus-control prescaler circuit according to the prior art will be described with reference to FIG. 15, which is a diagram illustrating the prescaler 207 and counters 209 and 210 extracted from the PLL circuit shown in FIG. 14.

As shown in FIG. 15, the prescaler 207 includes D-type flip-flops 22 to 25 each of which has its data output terminal connected to the data input terminal of the D-type flip-flop of the next stage and each of which has a clock terminal to which an output signal of the voltage-controlled oscillator (referred to simply as a "VCO") 206 is supplied to thereby construct a 4-stage shift register; an OR gate 21 having a first input terminal connected to an inverting output terminal QB of the D-type flip-flop 25 and an output terminal connected to the data input terminal of the D-type flip-flop 22; an OR gate 26 having a non-inverting output terminal Q of the D-type flip-flop 25 and the output terminal of an OR gate 28 connected to first and second input terminals, respectively; and a D-type flip-flop 27 having the output terminal of the OR gate 26 connected to its data input terminal and having the output clock of the VCO 206 input to its clock terminal. The D-type flip-flop 27 has an inverting output terminal QB connected to the second input terminal of the OR gate 21. The non-inverting output terminal Q of the D-type flip-flop 25 is input to the clock input terminal of the D-type flip-flop 29 and the inverting output terminal QB of the D-type flip-flop 29 is connected to its own data input terminal to thereby construct a frequency dividing circuit. The non-inverting output terminal Q of the D-type flip-flop 29 is input to the clock input terminal of the D-type flip-flop 30 and the inverting output terminal QB of the D-type flip-flop 30 is connected to its own data input terminal to thereby construct a frequency dividing circuit. The non-inverting output terminal Q of the D-type flip-flop 30 is output to the A counter 209 and B counter 210 as the frequency-divided output of the prescaler 207. The MC signal and the non-inverting output terminals Q of the D-type flip-flops 29 and 30 are input to the OR gate 28, the output of which is input to the OR gate 26.

Assume that the MC signal is at logic "1" (=HIGH). At such time the OR gate 28, one input of which is the MC signal, outputs logic "1". The OR gates 26 outputs "1" at all times. In response to the output clock of the VCO 206, the D-type flip-flop 27 latches logic "1", which is applied to its data input terminal, outputs logic "0" from its inverting output terminal QB and delivers this output to the OR gate 21.

The prescaler 207 is of the type that performs frequency division by 32 or 33. First, however, the 4-stage shift register comprising the D-type flip-flops 22, 23, 24, and 25 is driven by the output clock of the VCO 206 to perform frequency division by 8.

More specifically, the 4-stage shift register comprising the D-type flip-flops 22, 23, 24, and 25 composes a 4-bit ring counter driven by the output clock of the VCO 206. If the inverting output terminal QB of the D-type flip-flop 25 is "1", the output of the OR gate 21 is "1". One round is completed by eight clocks, which enter one at a time as the output clock from the VCO 206. The states of the D-type flip-flops 25, 24, 23, and 22 undergo a transition as follows: The state initially is "0000" and becomes "0001", "0011", "0111""1111", "1110", "1100", "1000", and "0000" at the first, second, third, fourth, fifth, sixth, seventh and eighth clocks, respectively, of the output clocks from the VCO 206. The D-type flip-flop 25 alternatingly outputs four clocks of successive "1"s and four clocks of successive "0"s. Thus, the output of the D-type flip-flop 25 is a signal obtained by 1/8 division of the frequency of the output clock from the VCO 206.

The output of the D-type flip-flop 25 is input to the OR gate 26. The OR gate 26 inputs "1" to the data input terminal of the D-type flip-flop 27 and the inverting output terminal QB of the D-type flip-flop 27 is made "0".

The non-inverting output terminals Q of the D-type flip-flops 29 and 30 enter the OR gate 28, the output of which is input to the data input terminal of the D-type flip-flop 27 via the OR gate 26.

The two stages of D-type flip-flops 29 and 30 compose a divide-by-4 frequency dividing circuit. The output of the 4-stage shift register comprising the D-type flip-flops 22, 23, 24 and 25 is divided by 4 by the D-type flip-flops 29 and 30. Thus, division by 32 is achieved.

When the MC signal is at logic "0" (=LOW), on the other hand, the OR gate 28 outputs logic "0" when the non-inverting output terminals Q of the D-type flip-flops 30 and 29 are both "0". The OR gate 26 transmits the output at the non-inverting output terminal Q of D-type flip-flop 25 to the data input terminal D of the D-type flip-flop 27.

More specifically, the flip-flops 29 and 30 clocked by the 1/8 frequency-divided output of the 4-stage register comprising the D-type flip-flops 22, 23, 24 and 25 changes in state in the manner "1010", and "1100". The output of the OR gate 28 becomes "0" if the outputs of the flip-flops 29, 30 both become "0", i.e., at a rate of once per four clocks output from the D-type flip-flop 25. When the output of the OR gate 28 is "0", the D-type flip-flop 27 constructs a shift register together with the D-type flip-flops 22, 23, 24, and 25. At the moment the output of the OR gate 28 changes to "0", the state of the D-type flip-flop 27 is "1" (because the output of OR gate 28 is "1" immediately prior thereto and "1" enters the data input terminal D of the D-type flip-flop 27 via the OR gate 26), the inverting output terminal QB of the D-type flip-flop 27 is "0", the state of the D-type flip-flop 25 is "0" and the inverting output terminal QB of the D-type flip-flop 25 becomes "1".

If the output of the OR gate 28 is "0", the OR gate 26 transmits the output of the D-type flip-flop 25 to the data input terminal of the D-type flip-flop 27 as is. Whenever the output clock of the VCO 206 enters, the states of the D-type flip-flops 27, 25, 24, 23, and 22 undergo a transition in nine clock cycles in the following manner: "10000", "00001", "00011", "00111", "01111", "11111", "11110", "11100", "11000", and "10000".

That is, the shift register of prescaler 207 implements frequency division by 9. Among the four cycles of the divide-by-4 frequency dividing circuit of D-type flip-flops 29 and 30, division by 8 are executed in three cycles and division by 9 in one cycle.

Accordingly, when signal MC="0" holds, the frequency-dividing factor of prescaler 207 is $$8 \times 3 + 9 = 33$$

Described next will be a case where frequency division by N is carried out using a pulse-swallow-type variable frequency dividing circuit that employs the prescaler 207 and two programmable counters 209 and 210. Let N represents the total frequency-dividing factor. If a represents the quotient and b the remainder (where 0<b<32 holds) when N is divided by 32 (though a number other than 32 may be used, 32 is adopted here owing to the relationship to FIG. 15), then N will become as follows:

$$N = 32 \times a + b$$

In a case where N is obtained by frequency division by 32, 33, the above is transformed to $$N = 32 \times (a-b) + 33 \times b$$

(where a>=b holds) and remainder b can be implemented by an operation dividing by 33 and dividing by 32 the remaining number of times. A pulse-swallow counter is implemented by the combination of two binary counters 209 and 210. In case of frequency division by 32, 33, a is the quotient obtained by dividing N by 32, e.g., a value of the six higher order bits or more, and b takes on the value of the five lower order bits. When an actual operation is performed, the A counter 209 and B counter 210 both count up to set count values A', B' or count down from the set values A', B' simultaneously in response to the output of the prescaler 207. In this case, the values A', B' become a, b, respectively.

Until the prescribed value b is attained or until the B counter 210 counts down to 0 starting from the count value b, the MC signal is placed at LOW level and the prescaler 207 performs division by 33. In other words, the B counter 210 counts the 1/33 frequency-divided output of the prescaler 207 b times. After the B counter 210 has counted the 1/33 frequency-divided output of the prescaler 207 b times, the MC signal is placed at HIGH level. The A counter 209 counts the 1/32 frequency-divided output of the prescaler 207 (a−b) times, namely the remaining number of times until the count value a is attained or until 0 is reached starting from a.

The frequency-dividing factor N, namely $$N = 32 \times (a-b) + 33 \times b$$

is realized by this series of operations. Thus it is possible to realize any frequency-dividing factor N.

With regard to publications relating to the above-described pulse-swallow-type variable frequency dividing circuit equipped with a prescaler having two frequency-dividing factors P and (P+1) and two counters, see the specifications of JP Patent Kokai Publication JP-A-6-69788 and JP-A-6-120815, by way of example.

In a case where the structure of the above-described pulse-swallow-type variable frequency dividing circuit is such that the output frequency of the VCO 206 is close to the boundary operating frequency of the device constituting the prescaler 207, adopting a hierarchical arrangement for the counters is a useful technique for obtaining any number of frequency divisions in an efficient manner.

However, since it is necessary to operate the shift register of the prescaler 207 by the output clock of the VCO 206, a large number of elements that operate at high speed are required.

Further, reducing power consumption is difficult because the A counter 209 and B counter 210 are operated simultaneously.

Furthermore, the MC signal supplied to the prescaler 207 is required to operate earlier than the output period of the prescaler 207, which performs a high-speed frequency dividing operation. This makes it difficult to design the proper timing.

SUMMARY OF THE DISCLOSURE

Because the frequency of the VCO output is high relative to the device speed, the variable frequency divider relying upon the pulse-swallow counter arrangement is used to achieve frequency division to the desired frequency in a variable frequency dividing circuit for adjusting the frequency multiplication factor of a synthesizer PLL, etc. However, since frequency division in the high-speed portion is carried out by a dual modulus prescaler having two frequency-dividing factors P and P+1 [1/P, 1/(P+1) frequency division], it is necessary to construct the shift register within the prescaler in conformity with the high frequency of the VCO output. In addition, a large amount of power is consumed owing to the parallel arrangement of the A counter and B counter constituting the programmable counters.

Furthermore, it is difficult to control the timing of the MC (modulus control) signal, which is the signal that controls the changeover of the number of frequency divisions of the dual modulus prescaler. As a consequence, high-speed operation is difficult.

The prescaler, counter and control circuit, etc., are placed close together taking into consideration wiring delay of the MC signal, which requires high-speed operation. This makes it difficult to place the prescaler and control circuit on separate chips, thereby limiting freedom of circuit design.

Accordingly, it is an object of the present invention to provide a variable frequency dividing circuit that reduces power consumption and facilitates design of timing, a PLL circuit equipped with this frequency dividing circuit, and a method of clock control.

The above and other objects of the invention are attained by a variable frequency dividing circuit in accordance with one aspect of the present invention, which comprises a first frequency dividing circuit for performing frequency-division of an input signal by a first value P (where P is a positive integer); a second frequency dividing circuit for dividing the P-frequency-divided output of the first frequency dividing circuit by a second value A (where A is a positive integer); a circuit for generating two signals, which have a phase difference equivalent to one period of the P-frequency-divided output of the first frequency dividing circuit, whenever frequency-division by A is performed by the second frequency dividing circuit; and an interpolator, to which the two generated signals are input, for generating and outputting an output signal of a phase obtained by interpolating the phase difference between the two input signals in accordance with an interior division ratio set by a control signal applied thereto; wherein the interpolator produces an output signal, the phase of which is a predetermined multiple of a unit obtained by dividing the phase difference equivalent to one period of the P-frequency-divided output of the first frequency dividing circuit by P in accordance with the interior division ratio, where P represents the dividing number of the phase difference, and means are provided for incrementing or decrementing the interior division ratio of the interpolator, whenever frequency-division by A is performed by the second frequency dividing circuit, by B times the unit obtained by dividing the phase difference equivalent to one period of the P-frequency-divided output of the first frequency dividing circuit by P (where B is a positive integer that is less than P); the frequency of the output signal of the interpolator being made a value obtained by performing frequency-division of the input signal by A×P+B.

In accordance with another aspect of the present invention, the foregoing object is attained by providing a variable frequency dividing circuit comprising a first frequency dividing circuit for performing frequency-division of an input signal by a first value P (where P is a positive integer); a second frequency dividing circuit for dividing the P-frequency-divided output of the first frequency dividing circuit by a second value A (where A is a positive integer); a circuit for generating two signals, which have a phase difference equivalent to one period of the P-frequency-divided output of the first frequency dividing circuit, whenever frequency-division by A is performed by the second frequency dividing circuit; an interpolator, to which the two generated signals are input, for generating and outputting an output signal of a phase obtained by interpolating the phase difference between the two signals in accordance with an interior division ratio set by a control signal applied thereto; the interpolator adopting P×M (where M is a predetermined positive integer) as the dividing number of the phase difference; and the interpolator producing an output signal, the phase of which is a predetermined multiple of a unit obtained by dividing the phase difference equivalent to one period of the P-frequency-divided output of the first frequency dividing circuit by P×M; and a control circuit is provided for exercising control in such a manner that a fixed value B×M+K (where K is a predetermined positive integer than is less than M) is added to a preceding value C1 of an interior division ratio C1:P−C1 of the interpolator whenever frequency-division by A is performed by the second frequency dividing circuit, a remainder obtained by dividing the result of addition by P×M is adopted as the present value C1 of the interior division ratio of the interpolator, and if the value obtained by adding the constant value B×M+K to the preceding value C1 of the interior division ratio is equal to or greater than M×P, 1 is added to the frequency-dividing factor of the second frequency dividing circuit to perform frequency-division by A+1; the interpolator producing an output signal whose frequency-dividing factor is A×P+B+K/M.

A PLL circuit in accordance with a further aspect of the present invention comprises a phase comparator circuit having a first input terminal to which a reference clock is applied for outputting a phase difference; a charge pump for generating a voltage conforming to the phase difference output from the phase comparator circuit; a loop filter for smoothing the voltage conforming to the phase difference; a voltage-controlled oscillator, to which an output of the loop filter is input as a control signal, for outputting a clock having an oscillation frequency prescribed by the control signal; a first frequency dividing circuit, to which the output clock of the voltage-controlled oscillator is input, for performing frequency-division of the clock signal by a first value P; a second frequency dividing circuit for dividing the P-frequency-divided output of the first frequency dividing circuit by a second value A; a circuit for generating two signals, which have a phase difference equivalent to one period of the P-frequency-divided output of the first frequency dividing circuit, whenever frequency-division by A is performed by the second frequency dividing circuit; and an interpolator, to which the two generated signals are input, for generating and outputting an output signal of a phase obtained by interpolating the phase difference between the two signals in accordance with an interior division ratio set by a control signal applied thereto; wherein the interpolator produces an output signal, the phase of which is a predetermined multiple of a unit obtained by dividing the phase difference equivalent to one period of the P-frequency-divided output of the first frequency dividing circuit by P in accordance with the interior division ratio, where P represents the dividing number of the phase difference, and means are provided for incrementing or decrementing the interior division ratio of the interpolator, whenever frequency-division by A is performed by the second frequency dividing circuit, by B times the unit obtained by dividing the phase difference equivalent to one period of the P-frequency-divided output of the first frequency dividing circuit by P (where B is a positive integer that is less than P); the output signal of the interpolator being applied to a second input terminal of the phase comparator circuit, whereby its phase is compared with that of the reference clock.

In a PLL circuit in accordance with another aspect of the present invention, the interpolator adopts P×M (where M is a predetermined positive integer) as the dividing number of the phase difference, and produces an output signal, the phase of which is a predetermined multiple of a unit obtained by dividing the phase difference equivalent to one period of the P-frequency-divided output of the first frequency dividing circuit by P×M; and a control circuit is provided for exercising control in such a manner that a fixed value B×M+K (where K is a predetermined positive integer than is less than M) is added to a preceding value C1 of an interior division ratio C1:P−C1 of the interpolator whenever frequency-division by A is performed by the second frequency dividing circuit, a remainder obtained by dividing the result of addition by P×M is adopted as the present value C1 of the interior division ratio of the interpolator, and if the value obtained by adding the constant value B×M+K to the preceding value C1 of the interior division ratio is equal to or greater than M×P, 1 is added to the frequency-dividing factor of the second frequency dividing circuit to perform frequency-division by A+1; the output signal (frequency-dividing factor N=A×P+B+K/M) of the interpolator being applied to the second input terminal of the phase comparator circuit, whereby its phase is compared with that of the reference clock.

A clock control method in accordance with a further aspect of the present invention comprises the steps of performing frequency-division of an input signal by P (where P is a positive integer) by a first frequency dividing circuit; dividing the P-frequency-divided output of the first frequency dividing circuit by value A (where A is a positive integer) by a second frequency dividing circuit; generating two signals, which have a phase difference equivalent to one period of the P-frequency-divided output of the first frequency dividing circuit, whenever frequency-division by A is performed by the second frequency dividing circuit; inputting the two signals to an interpolator and generating and outputting an output signal having a phase obtained by interpolating the phase difference between the two signals in steps of B/P (where B is a positive integer less than P) in accordance with an interior division ratio set by a control signal; and incrementing or decrementing the interior division ratio of the interpolator B/P at a time whenever division by A is performed; the frequency of the input signal being divided by A×P+B. This clock control method further includes steps of adding B, which decides C1 of an interior division ratio C1:P−C1 of the interpolator, to the preceding value of C1 of the interior division ratio whenever frequency-division by A is performed by the second frequency dividing circuit, and calculating a remainder obtained by dividing the result of addition by P; setting the remainder to the value C1 of the interior division ratio of the interpolator; and performing control to add 1 to the frequency dividing factor A of the second frequency dividing circuit when the result of adding B to the preceding value C1 of the interior division ratio is equal to or greater than P, thereby performing division by A+1.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
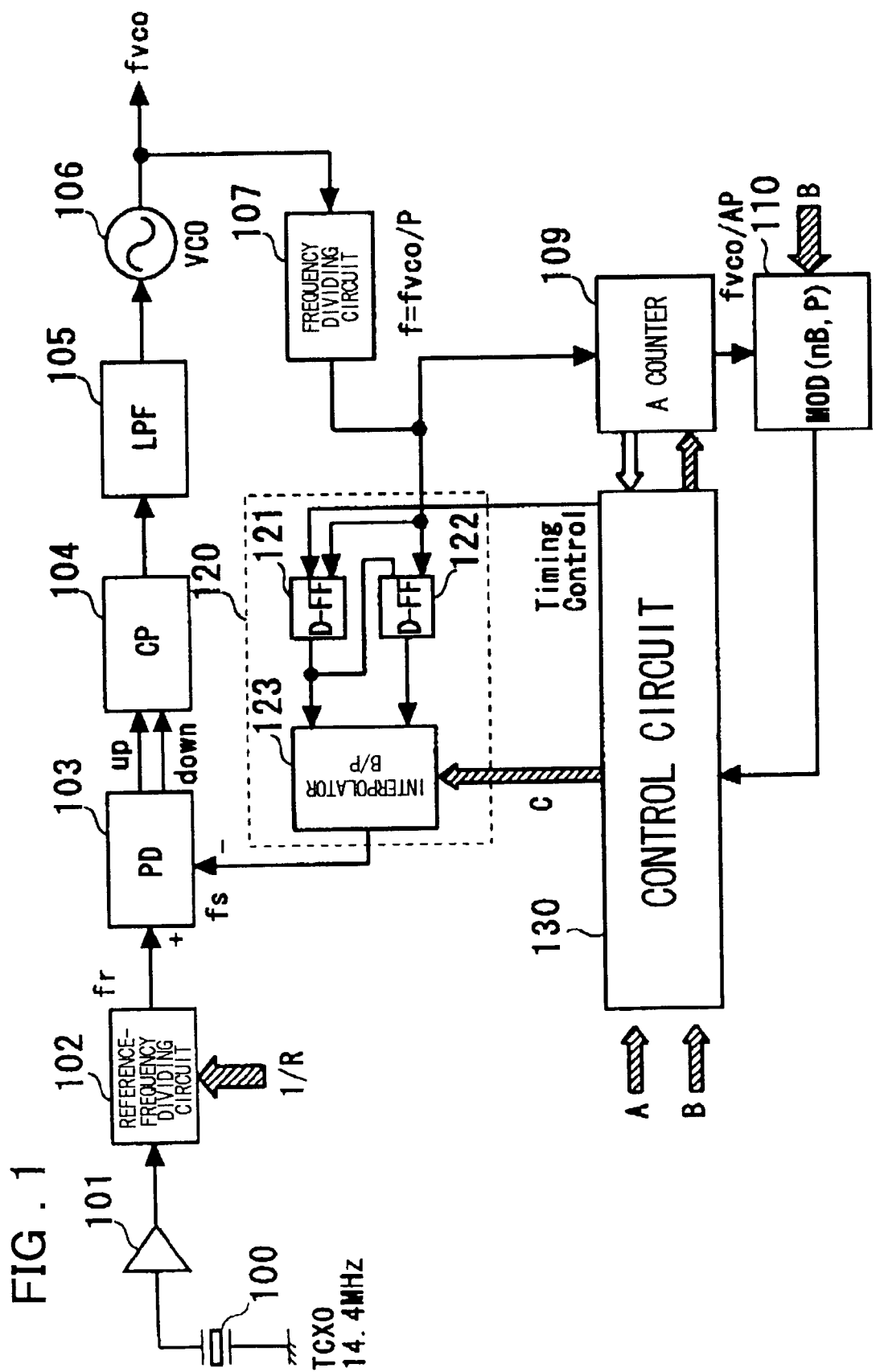
FIG. 1 is a block diagram illustrating the basic structure of a first embodiment according to the present invention.

Preferred embodiments of the present invention will now be described. As shown in FIG. 1, a frequency dividing circuit in accordance with a preferred embodiment of the present invention includes a first frequency dividing circuit (107) for performing frequency-division of an input signal by P (where P is a positive integer); a second frequency dividing circuit (109) for performing frequency-division of an output signal of the first frequency dividing circuit (107) by A (where A is a positive integer); a circuit (121, 122, 130) for generating two signals, which have a phase difference equivalent to one period of the P-frequency-divided output of the first frequency dividing circuit (107), whenever frequency-division by A is performed by the second frequency dividing circuit (109); an interpolator (123), which receives the two generated signals, for generating and outputting an output signal of a phase obtained by interpolating the phase difference between the two signals in steps of B/P (where B is a positive integer less than P) in accordance with an interior division ratio set by a control signal applied thereto; and means (110, 130) for incrementing or decrementing the interior division ratio of the interpolator (123) B/P at a time whenever frequency-division by A is performed by the second frequency dividing circuit (109). The interpolator (123) outputs a signal in which the frequency of the input signal has been divided by a frequency-dividing factor N, where N=A×P+B.

An arithmetic circuit (110) is provided for adding B to the preceding value C1 of the interior division ratio (C1:P−C1) of the interpolator (123) whenever frequency-division by A is performed by the second frequency dividing circuit (109), and outputting a remainder obtained by dividing the result of addition by P. A control circuit (130) is provided for performing control to set the remainder, which is output from the arithmetic circuit (110), to the value C1 of the interior division ratio of the interpolator (123), and to add 1 to the frequency dividing factor A of the second frequency dividing circuit (109) when the result of adding B to the preceding value C1 of the interior division ratio is equal to or greater than P, thereby performing division by A+1.

In accordance with another embodiment of the present invention, the interpolator (123) is such that P×M (where M is a predetermined positive integer) represents the dividing number by which the phase difference is divided, and the interpolator (123) produces an output signal having a phase which is a prescribed multiple of a unit obtained by dividing the phase difference equivalent to one period of the P-frequency-divided output of the first frequency dividing circuit (107) by P×M. A control circuit (130) is provided for exercising control in such a manner that a fixed value B×M+K (where K is a predetermined positive integer that is less than M) is added to a preceding value C1 of an interior division ratio C1:P−C1 of the interpolator whenever frequency-division by A is performed by the second frequency dividing circuit (109), a remainder obtained by dividing the result of addition by P×M is adopted as the present value C1 of the interior division ratio of the interpolator, and 1 is added to the frequency-dividing factor of the second frequency dividing circuit (109) to perform frequency-division by A+1 if the value obtained by adding the constant value B×M+K to the preceding value C1 of the interior division ratio of the interpolator (123) is equal to or greater than P×M. The interpolator (123) produces an output signal in which the frequency of the input signal has been divided by a frequency-dividing factor that is equal to A×P+B+K/M.

Figure 4:
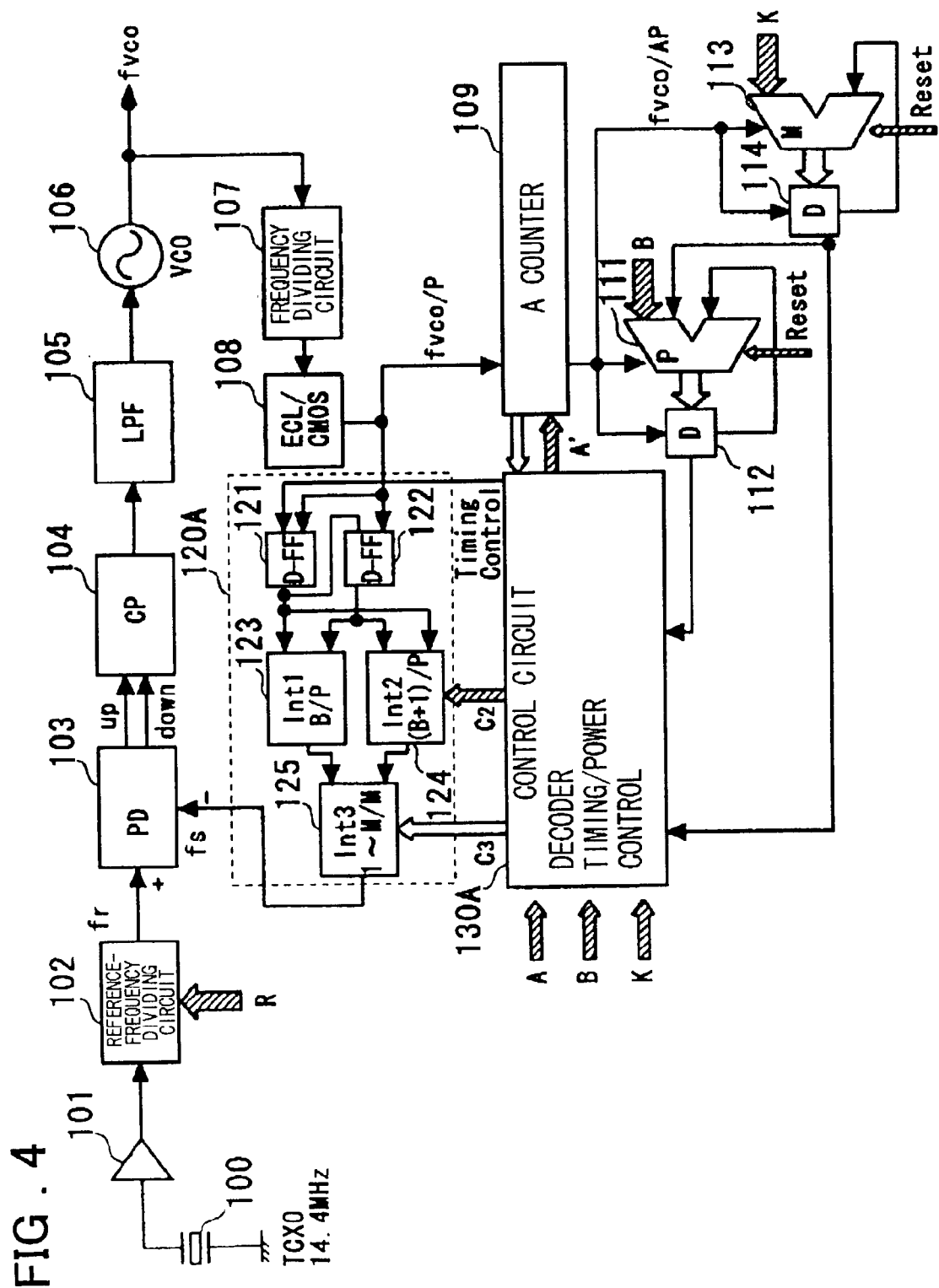
FIG. 4 is a block diagram illustrating the structure of a second embodiment according to the present invention.

In accordance with another embodiment of the present invention, the interpolator has a two-stage architecture, as shown in FIG. 4. Here a phase difference equivalent to one period of the P-frequency-divided output is interpolated by a first interpolator (123) in accordance with an interior division ratio C:P−C and by a second interpolator (124) in accordance with an interior division ratio C:P−(C+1). The phase difference 1/P (one period of the input signal) between the two signals output from the first and second interpolators (123, 124) is interpolated by a third interpolator (125) in accordance with an interior division ratio C2:M−C2, whereby fractional division (A×P+B+K/M) is realized. In the first and second interpolators (123, 124), the interior division ratio is incremented (or decremented) in steps of B whenever division by A is performed. In the third interpolator (125), the interior division ratio is incremented (or decremented) in steps of K whenever division by A is performed.

Figure 11:
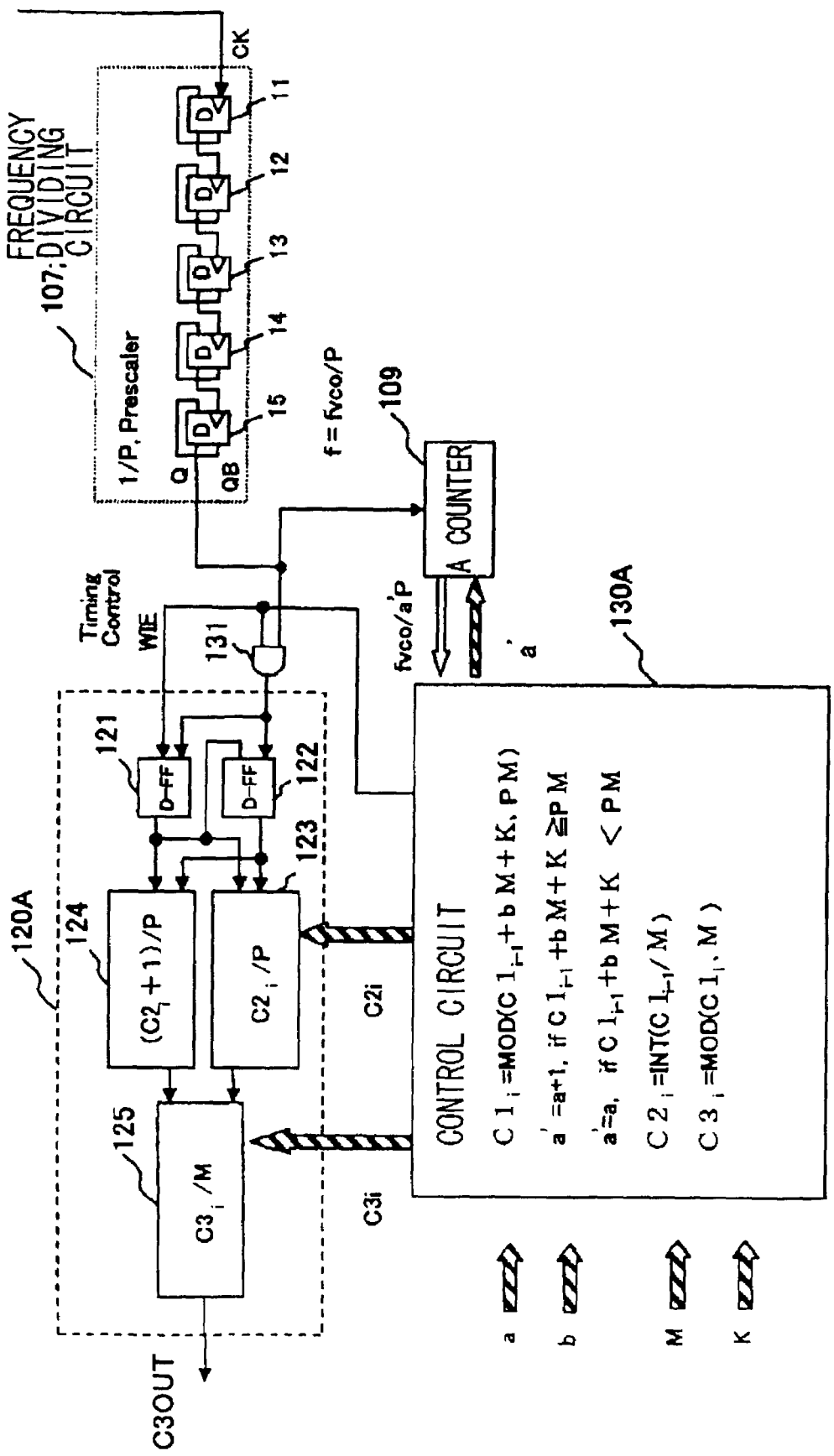
FIG. 11 is diagram useful in describing the operation of the control circuit according to the second embodiment.

In accordance with another embodiment of the present invention, as shown in FIG. 11, there are provided circuits (121, 122, 130A) for generating two signals, which have a phase difference equivalent to one period of the P-frequency-divided output of the first frequency dividing circuit, whenever frequency-division by A is performed by the second frequency dividing circuit (109); first and second interpolators (123, 124), to which the two generated signals are input, each for generating and outputting an output signal of a phase obtained by interpolating the phase difference between the two signals in accordance with respective ones of interior division ratios set by a control signal applied thereto; and a third interpolator (125), to which the signals output from the first and second interpolators (123, 124) are input, for generating and outputting an output signal of a phase obtained by interpolating the phase difference between these two input signals. The first interpolator (123) interpolates phase in accordance with an interior division ratio C2:P−C2 in steps of a value obtained by dividing the phase difference between the two input signals by P. The second interpolator (124) interpolates phase in accordance with an interior division ratio C2+1:P−(C2+1) in steps of a value obtained by dividing the phase difference between the two input signals by P. The third interpolator (125) interpolates phase in accordance with an interior division ratio C3:M−C3 in steps of a value obtained by dividing the phase difference between the signals, which are output from the first and second interpolators (123, 124), by M (where M is a predetermined positive integer).

In this embodiment, a control circuit (130A) is provided for exercising control so as to make the total interior division ratio of the first to third interpolators equal to C1:P×M−C1, add a constant value B×M+K (where K is a predetermined positive integer that is less than M) to the preceding value C1 of the total interior division ratio C1:P−C1, adopt a remainder, which is obtained by dividing the result of addition by P×M, as the present value C1 of the total interior division ratio, and add 1 to the frequency-dividing factor of the second frequency dividing circuit (109) to perform frequency-division by A+1 if the value obtained by adding the constant value B×M+K to the preceding value C1 of the total interior division ratio is equal to or greater than P×M. The value C2 of the interior division ratios of the first and second interpolators (123, 124) is an integral part obtained by dividing C1 by M, and C3 in the third interpolator (125) is the remainder obtained by dividing C1 by M. The third interpolator (125) outputs a signal in which the frequency of the input signal has been divided by a frequency-dividing factor A×P+B+K/M.

Figure 12:
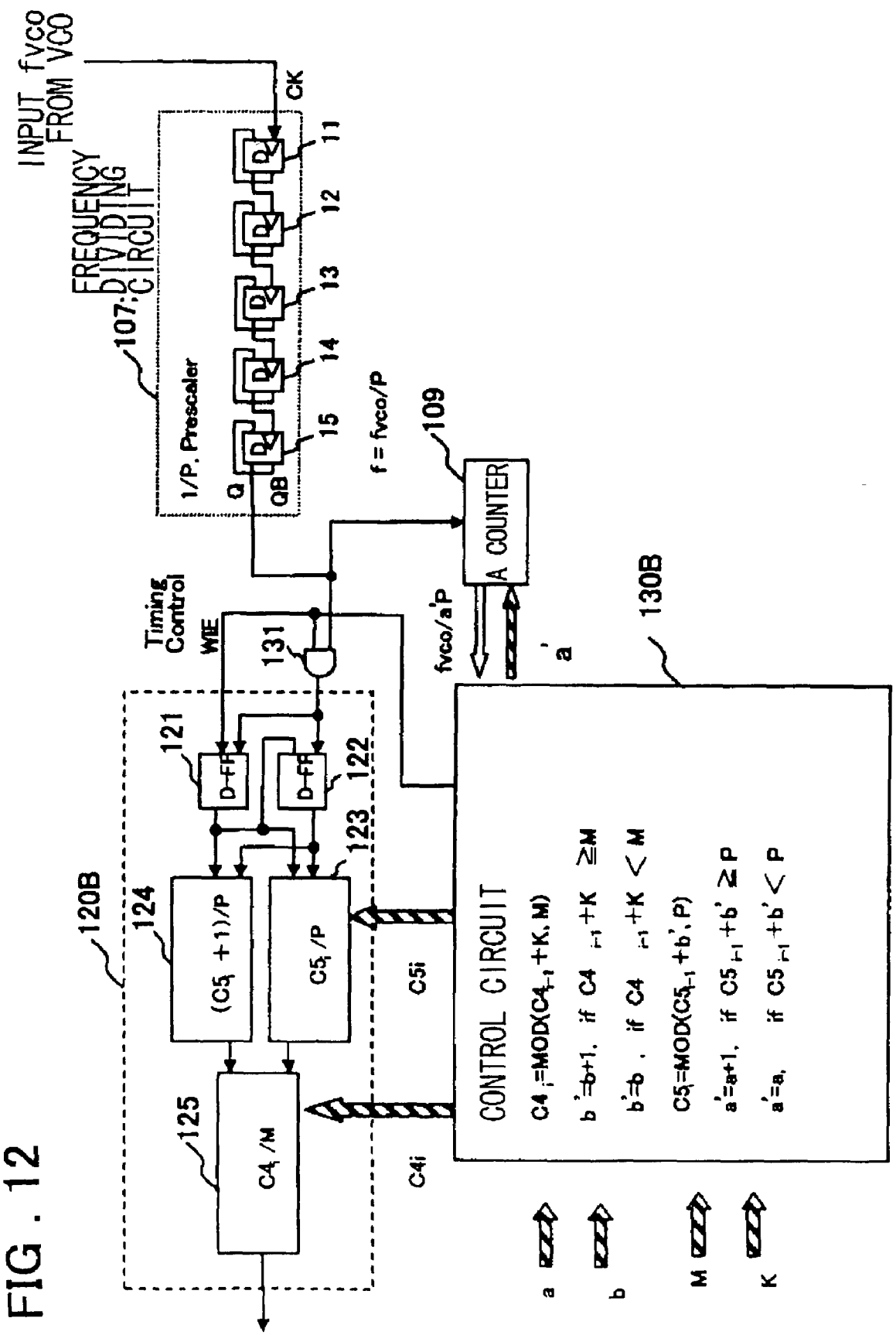
FIG. 12 is diagram useful in describing the operation of the control circuit according to a third embodiment of the present invention.

In accordance with another embodiment of the present invention, as shown in FIG. 12, there are provided first and second interpolators (123, 124) of a first stage, to which two signals are input, each for generating and outputting an output signal of a phase obtained by interpolating the phase difference between the two input signals in accordance with respective ones of interior division ratios set by a control signal applied thereto; and a third interpolator (125) of a successive stage, to which the outputs from the first and second interpolators (123, 124) are input, for generating and outputting an output signal of a phase obtained by interpolating the phase difference between these two input signals. The first interpolator (123) interpolates phase in accordance with an interior division ratio C5:P−C5 in steps of a value obtained by dividing the phase difference between the two input signals by P. The second interpolator (124) interpolates phase in accordance with an interior division ratio C5+1:P−(C5+1) in steps of a value obtained by dividing the phase difference between the two input signals by P. The third interpolator (125) interpolates phase in accordance with an interior division ratio C4:M−C4 in steps of a value obtained by dividing the phase difference between the two inputs signals by M (where M is a predetermined positive integer). Also provided is a control circuit (130B) having first-stage control means for exercising control so as to add a third value B (where B is a predetermined positive integer that is less than P) to preceding values C5, C5+1 of the interior division ratios of the first and second interpolators (123, 124) whenever frequency-division by A is performed by the second frequency dividing circuit (109), and adopt the remainders, which are obtained by dividing the results of addition by P, as the present values C5, C5+1 of the first and second interpolators, respectively; and second-stage control means for exercising control so as to add a fourth value K (where K is a predetermined positive integer that is less than M) to the preceding value C4 of the interior division ratio of the third interpolator (125) whenever frequency-division by A is performed by the second frequency dividing circuit (109), and adopt the remainder, which is obtained by dividing the result of addition by M, as the present value C4 of the third interpolator (125). The control circuit (130B) adds 1 to B if the value obtained by adding K to the preceding value C4 of the interior division ratio of the third interpolator (125) is equal to or greater than M, and adds 1 to the frequency dividing factor A of the second frequency dividing circuit if the value obtained by adding B to the preceding value C5 of the first and second interpolators (123, 124) is equal to or greater than P. The third interpolator produces an output signal in which the frequency of the input signal has been divided by a frequency-dividing factor A×P+B+K/M.

Thus, an arrangement may be adopted in which the frequency of the input signal is fractionally divided (by A×P+B+K/M).

A PLL circuit according to an embodiment of the present invention comprises a phase comparator circuit (103) to which a reference signal is input; a charge pump (104) for generating a voltage corresponding to a phase difference by charging or discharging a capacitance based upon a signal output from the phase comparator circuit (103); a loop filter (105) for smoothing the voltage corresponding to the phase difference; and a voltage-controlled oscillator (106), to which the output voltage of the loop filter (105) is input as a control voltage, for outputting a clock having an oscillation frequency that corresponds to the control voltage; wherein the output clock of the voltage-controlled oscillator (106) is frequency-divided by a frequency dividing circuit and fed back to the phase comparator circuit (103). The frequency dividing circuit of the PLL circuit, in which the phase difference between a reference clock and a frequency-divided clock is sensed by the phase comparator circuit (103), is constituted by the variable frequency dividing circuit of the present invention described above.

In a PLL circuit in accordance with an embodiment of the present invention, a first frequency dividing circuit (107), to which a clock having the oscillation frequency of a voltage-controlled oscillator (106) is input, for performing frequency-division of the clock at high speed is obtained by cascade-connecting simple toggle circuits (a frequency dividing circuit based upon D-type flip-flops). The PLL circuit outputs a signal having a phase obtained by interpolating a phase difference equivalent to one period of the frequency-divided output of the first frequency dividing circuit in accordance with an applied division ratio, thereby implementing integral frequency division (A×P+B) or fractional frequency division (A×P+B+K/M). This makes it possible to simplify the structure of the first frequency dividing circuit, carry out high-speed operation and reduce power consumption. Further, a second frequency dividing circuit is provided for dividing the P-frequency-divided output of the first frequency dividing circuit by A. Two counters, which are required in a pulse-swallow variable frequency dividing circuit, at no longer necessary.

In a PLL circuit, in accordance with an embodiment of the present invention, a prescaler and a phase adjusting circuit are provided, the number of high-speed operating elements is reduced and, hence, so is power consumption, in comparison with an arrangement having a P/P+1 prescaler. The prescaler is simple in construction and is ideal for high-speed operation. Further, in comparison with the pulse-swallow arrangement, the present invention is such that only one counter suffices as a programmable counter and less power is consumed. Furthermore, the interpolator and control circuit operate only one time in an interval in which the P-frequency-divided output of the prescaler is divided by A, as a result of which power consumption is reduced.

Further, in accordance with the embodiment of the present invention, control is simplified because there is no longer need for a modulus control signal for changing the frequency-dividing factor of a P/P+1 prescaler.

Embodiments of the present invention will now be described in detail with reference to the drawings.

FIG. 1 is a block diagram illustrating the structure of a PLL having a variable frequency dividing circuit according to the present invention.

As shown in FIG. 1, the PLL according to this embodiment comprises an amplifier 101 for amplifying the output (whose frequency ftcxo is 14.4 MHz) of an externally mounted temperature-compensated crystal oscillator (TCXO) 100; a reference-frequency dividing circuit 102 for frequency-dividing the output of the amplifier 101; a phase comparator 103 for sensing the phase difference between a reference signal (the frequency fr whereof is, e.g., 14.4 MHz/36=400 kHZ), which is the result of frequency division by the reference-frequency dividing circuit 102, and a frequency-divided clock that is output from a phase adjusting circuit 120; a charge pump 104 for charging a capacitance (not shown) when the phase comparator 103 is outputting an UP signal in accordance with the result of the phase comparison and for discharging the charge, which has accumulated in the capacitance, when the phase comparator 103 is outputting a DOWN signal in accordance with the result of the phase comparison; a low-pass filter (loop filter) LPF 105 for smoothing the terminal voltage of the capacitance charged/discharged by the charge pump 104; a voltage-controlled oscillator (VCO) 106, to which the output voltage of the LPF 105 is input as a control voltage, for oscillating at a frequency conforming to the control voltage and outputting a signal having this frequency; a frequency dividing circuit (referred to also as a "prescaler") 107 for frequency-dividing the output of the voltage-controlled oscillator (VCO) 206 by a frequency-dividing factor P; an A counter 109 for counting the output of the frequency dividing circuit 107 to divide the output of the VCO by A and produce an output signal that is equal to the VCO output divided by A×P; a remainder calculating unit 110, which receives the output signal of the A counter 109, for outputting remainder MOD (nB,P); and a control circuit 130. A phase adjusting circuit 120 adjusts the phase of the P-frequency-divided output of the frequency dividing circuit 107 whenever frequency-division by A is performed by the A counter 109. The phase adjusting circuit 120 includes a D-type flip-flop 121 having a data input terminal to which a timing control signal from the control circuit 130 is applied and a clock input terminal to which the output of the frequency dividing circuit 107 is applied; a D-type flip-flop 122 having a data input terminal to which the output signal of the D-type flip-flop 121 is applied and a clock input terminal to which the output of the frequency dividing circuit 107 is applied; and an interpolator 123 having first and second input terminals to which the outputs of the D-type flip-flops 121, 122, respectively, are applied, for producing an output signal corresponding to a phase obtained by internally dividing the phase difference between the signals, which are applied to the first and second input terminals, based upon a control signal C from the control circuit 130. The output of the interpolator 123 is input to the phase comparator 103. The reference-frequency dividing circuit 102 is assumed to have a frequency-dividing factor R of 36, for example, and outputs a reference signal having a frequency (reference frequency) fr that is equal to 400 kHz. The output frequency of the VCO 106 is of the 800 MHz band 680.4 to 766.4 MHz) or 1.5 GHz band (1143.2 to 1370.95 MHz), by way of example.

Figure 14:
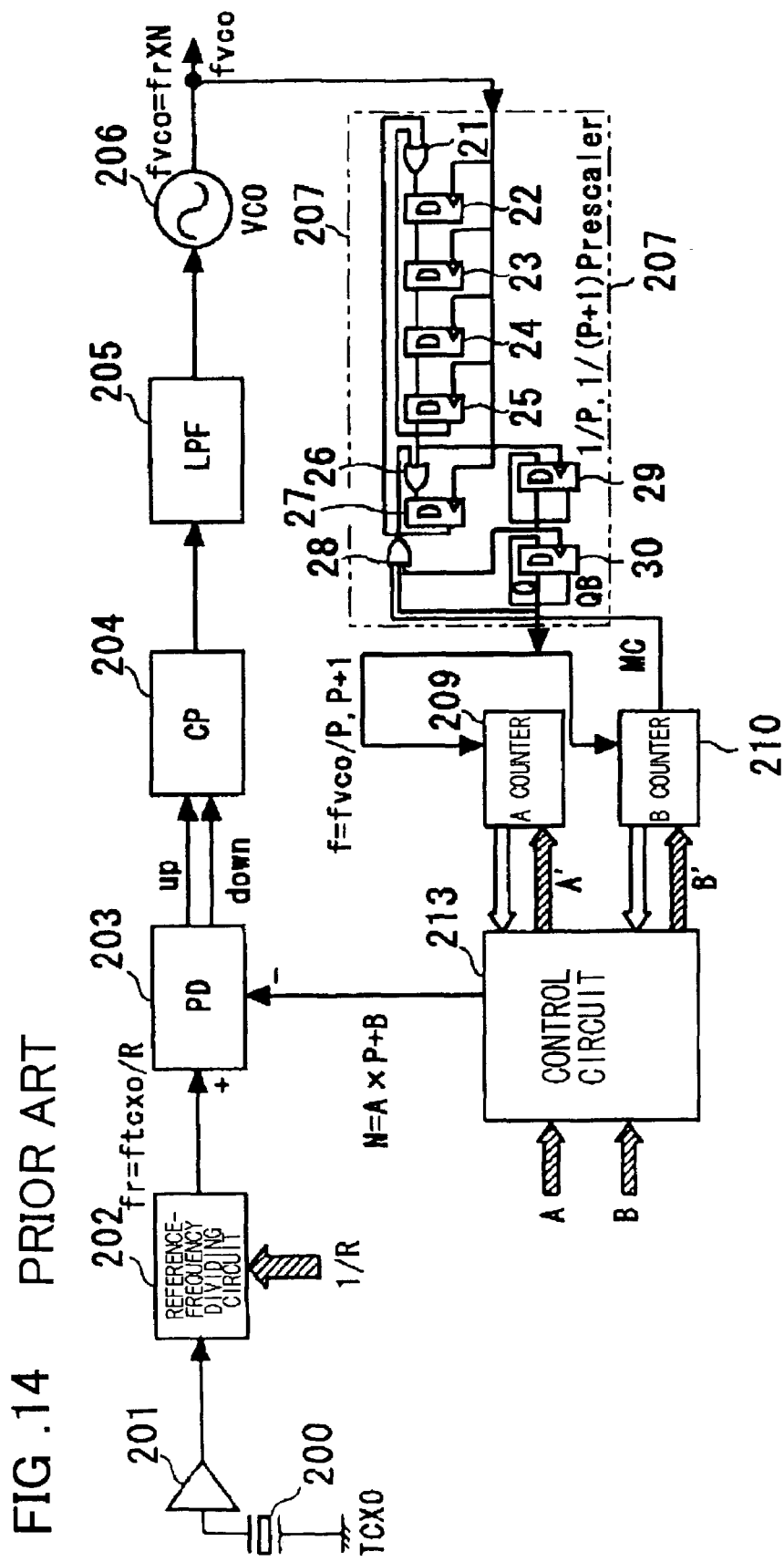
FIG. 14 is a diagram illustrating the structure of a PLL circuit having a pulse-swallow variable frequency dividing circuit.
Figure 15:
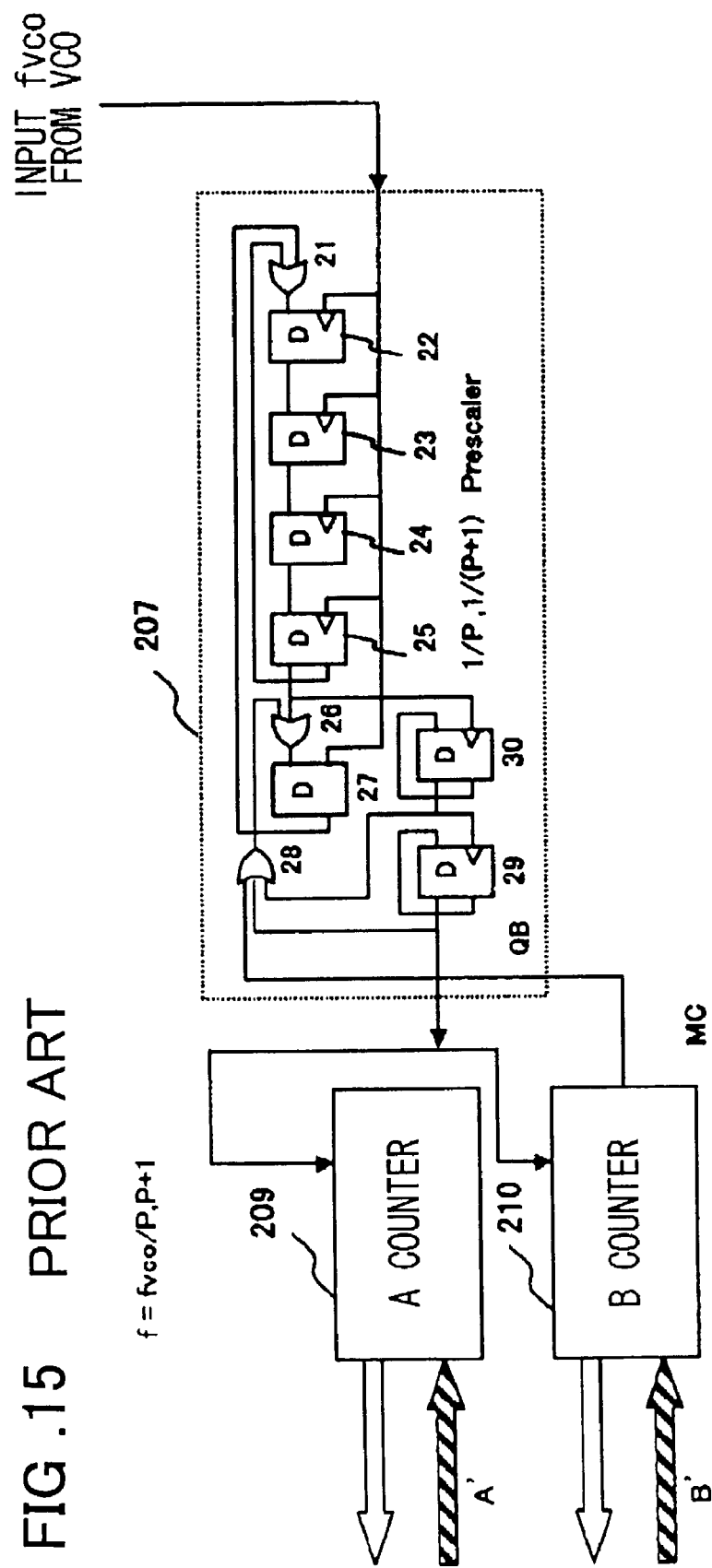
FIG. 15 is a diagram illustrating the structure of a prescaler shown in FIG. 14.

This embodiment of the present invention is equipped with the frequency dividing circuit (prescaler) 107, which performs high-speed frequency division, and the interpolator 123, which performs an interior division of the phase difference between its two input signals to vary the phase of the output signal, as a variable frequency dividing circuit for adjusting the frequency multiplication factor of a synthesizer PLL or the like, and outputs a signal obtained by interpolating the phase difference equivalent to the period of the P-frequency-divided output of the frequency dividing circuit 107, thereby fractionally dividing the P-frequency-divided output of the frequency dividing circuit 107 to implement a programmable frequency divider (variable frequency divider). In this embodiment of the present invention, the frequency-dividing factor of the frequency dividing circuit 107 is P, and there is no switching between division by P and division by P+1. Accordingly, a register obtained by cascade-connecting flip-flops constitutes the frequency dividing circuit 107. Further, in this embodiment of the present invention, a B counter (210 in FIGS. 14 and 15), which is required in a pulse-swallow variable frequency divider, is not provided.

The interpolator 123 is set to a ratio C1:P−C1, which is for internally dividing the phase difference between the two signals input thereto, by the control signal C, and is implemented by an interpolator of the type which inhibits feedthrough current, as will be described later.

The operation of this embodiment of the invention shown in FIG. 1 will now be described.

First, the output frequency fvco of the VCO 106 is divided down to fvco/P by the frequency dividing circuit 107, then this is further divided by A in the A counter 109 to obtain (fvco/P)/A Whenever the remainder calculating unit 110 receives a signal output from the A counter 109, which occurs each time the divided-by-P output of the frequency dividing circuit 107 is counted A times, i.e., whenever division by A is performed, the remainder calculating unit 110 adds B successively, calculates the remainder obtained by dividing the sum by P and supplies the control circuit 130 with the remainder as a value for setting the interior division ratio of the interpolator 123. In other words, the remainder calculating unit 110 adds B whenever frequency-division by A is performed by the A counter 109 and outputs, to the control circuit 130, the remainder MOD (nB,P), in which P of nB, which is the result of addition, is the modulus. It should be noted that the calculation symbol MOD (p,q) represents a remainder r obtained by dividing p by q.

The control circuit 130 outputs the control signal C, which controls the interior division ratio of interpolation by the interpolator 123, based upon the signal output from the A counter 109 whenever it divides by A (this signal is output at such time that the A counter 109 counts down to a value of zero or at such time that the A counter 109 counts up to the value A) and the output signal MOD (nB,P) from the remainder calculating unit 110.

On the basis of the control signal C, the interpolator 123 outputs a signal having a phase obtained by performing an interior division of the phase difference between the two input signals at a ratio C:P−C.

Further, the control circuit 130 supplies the data input terminal of the D-type flip-flop 121 of phase adjusting circuit 120 with a HIGH-level timing control signal (Timing Control) whenever frequency-division by A is performed by the A counter 109.

The D-type flip-flop 121, to the clock input terminal of which the P-frequency-divided output signal of the frequency dividing circuit 107 is applied, latches the timing control signal, which is output from the control circuit 130 whenever frequency-division by A is performed by the A counter 109, at the rising edge of the P-frequency-divided output signal from the frequency dividing circuit 107.

The second CMOS transfer gate 122 latches and outputs the output signal of the D-type flip-flop 121 at a rising edge of the next P-frequency-divided output signal from the frequency dividing circuit 107. The output signals of the D-type flip-flops 121 and 122 are fed to the interpolator 123. The phase difference with regard to the rising edges of the output signals from the D-type flip-flops, 121 and 122 coincides with one period of the P-frequency-divided output of frequency dividing circuit 107.

The interior division ratio of the interpolator 123 is set to C:P−C [where C=MOD (nB,P) holds] whenever frequency-division by A is performed by the A counter 109. The interpolator 123 produces an output signal having a phase obtained by incrementing or decrementing the preceding phase by B/P in steps of a value obtained by dividing one period of the P-frequency-divided output of the frequency dividing circuit 107 by P whenever division by A is performed, namely at the period at which interpolator 123 performs interpolation.

Let the period 1/fvco of the oscillating clock of VCO 106 be one unit. The currently interpolated phase of the (i+1)th output signal of interpolator 123 lags the previously interpolated phase of the i-th signal by B/P in steps of a value obtained by dividing one period of the P-frequency-divided output of frequency dividing circuit 107 by P. The period of the output signal of the current interpolation and previous interpolation is $$A \times P + (i+1) \times (B/P) \times P - [i \times (B/P) \times P] = A \times P + B$$

Hence the frequency-dividing factor N is equal to A×P+B.

Thus, in this embodiment of the present invention, a phase difference equivalent to the period fvco/P of the frequency dividing circuit 107 is interpolated by the interpolator 123 in steps of resolution 1/P, and use is made of a timing obtained by adding or subtracting a fixed ratio (B/P) at a time whenever frequency-division by A is performed by the A counter 109, thereby making it possible to divide by AP+B. Any frequency-dividing factor N, equivalent to that in an arrangement that relies upon a modulus control prescaler, is realized, and any frequency multiplication factor is implemented.

Figure 2:
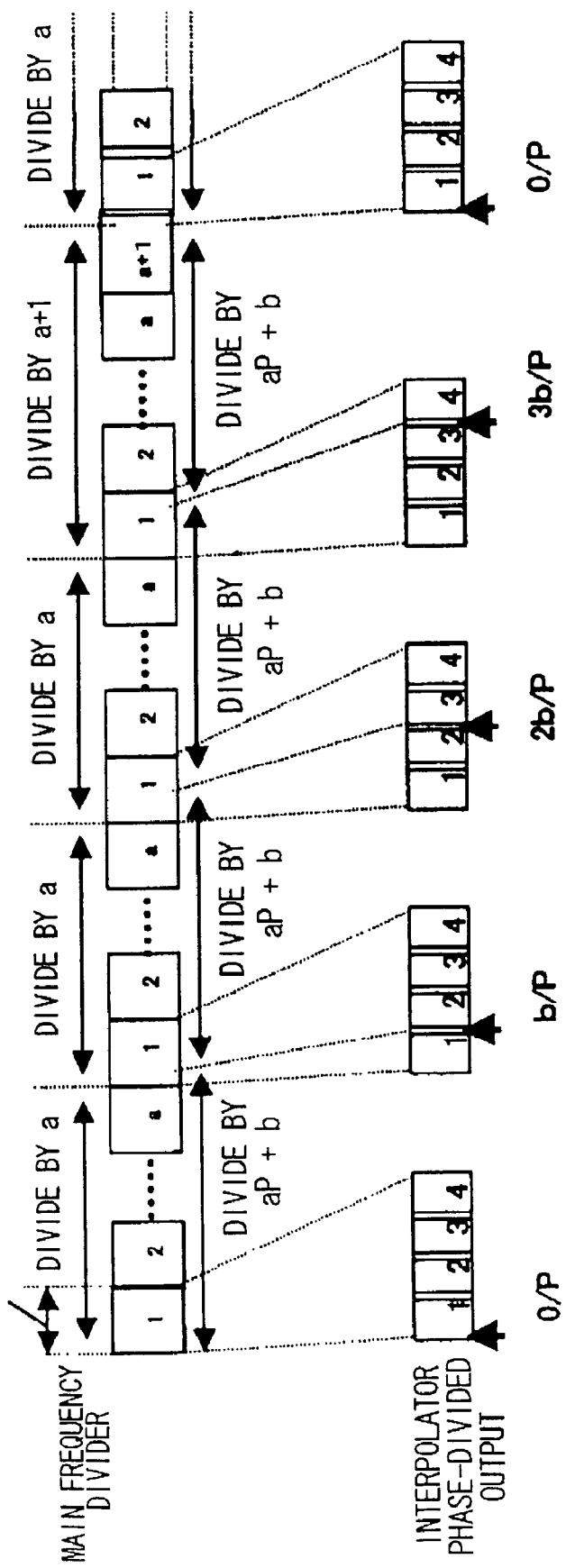
FIG. 2 is a diagram useful in describing the operation of the first embodiment.

FIG. 2 is a schematic view useful in describing implementation of frequency-dividing factor N=a×P+b (where P represents the frequency-dividing factor of the first frequency dividing circuit 107 and a the frequency-dividing factor of the A counter 109, and where 0<b<P holds) according to this embodiment of the present invention. The output of the frequency dividing circuit 107 is subjected to a correction, which adds on the phase of the interior division ratio b/P, by the interpolator 123 whenever division by a is performed. The main frequency divider shown in FIG. 2 refers to a frequency divider that is a combination of the frequency dividing circuit 107 and phase adjusting circuit 120 of FIG. 1. The main frequency divider implements division by a×P+b.

In the example shown in FIG. 2, interpolation of the phase of the output signal in interpolator 123 is updated in the manner 0/P, b/P, 2b/P, 3b/P, . . . , whenever frequency-division by a is performed, in steps of 1/P of one period of the P-frequency-divided output of the frequency dividing circuit 107.

In a case where nb becomes greater than P at the interior division ratio nb/P, which decides the phase of the output signal in interpolator 123, as shown in FIG. 2, the remainder obtained by dividing nb by P is made r[=MOD(nb,P)] and interpolation is performed at the dividing ratio r/P (interior division ratio r:P−r). Further, the frequency-dividing factor a of the A counter 109 is made (a+1) and the A counter 109 performs division by (a+1). For example, when frequency-division by a is performed by the A counter 109 (n−1) times in succession, the A counter 109 performs frequency-division by (a+1) and then the cycle based upon the frequency dividing factor A of A counter 109 is repeated (n−1) times. In other words, the following relation is established:

$$(n-1)(aP)+(a+1)P=n(aP+b)$$

In the example shown in FIG. 2, interpolation of phase by the interpolator 123 involves incrementing in the manner 0/P, b/P, 2b/P, 3b/P, . . . , whenever division by a is performed, in steps of 1/P of one period of the P-frequency-divided output of the frequency dividing circuit 107. However, it is permissible to adopt an arrangement in which decrementing is performed in the manner P/P, (P−b)/P, (P−2b)/P, (P−3b)/P, . . . (P−nb)/P, . . . , whenever frequency-division by a is performed.

In this case also the difference between the currently interpolated phase of the output signal of interpolator 123 and the previously interpolated phase of the output signal is b/P and the interpolator 123 outputs a signal of period a×P+b in steps of the period 1/fvco) of the output clock of VCO 106. When nb becomes greater than P, the phase dividing ratio is made [P−MOD(nb,P)]/P.

Figure 3:
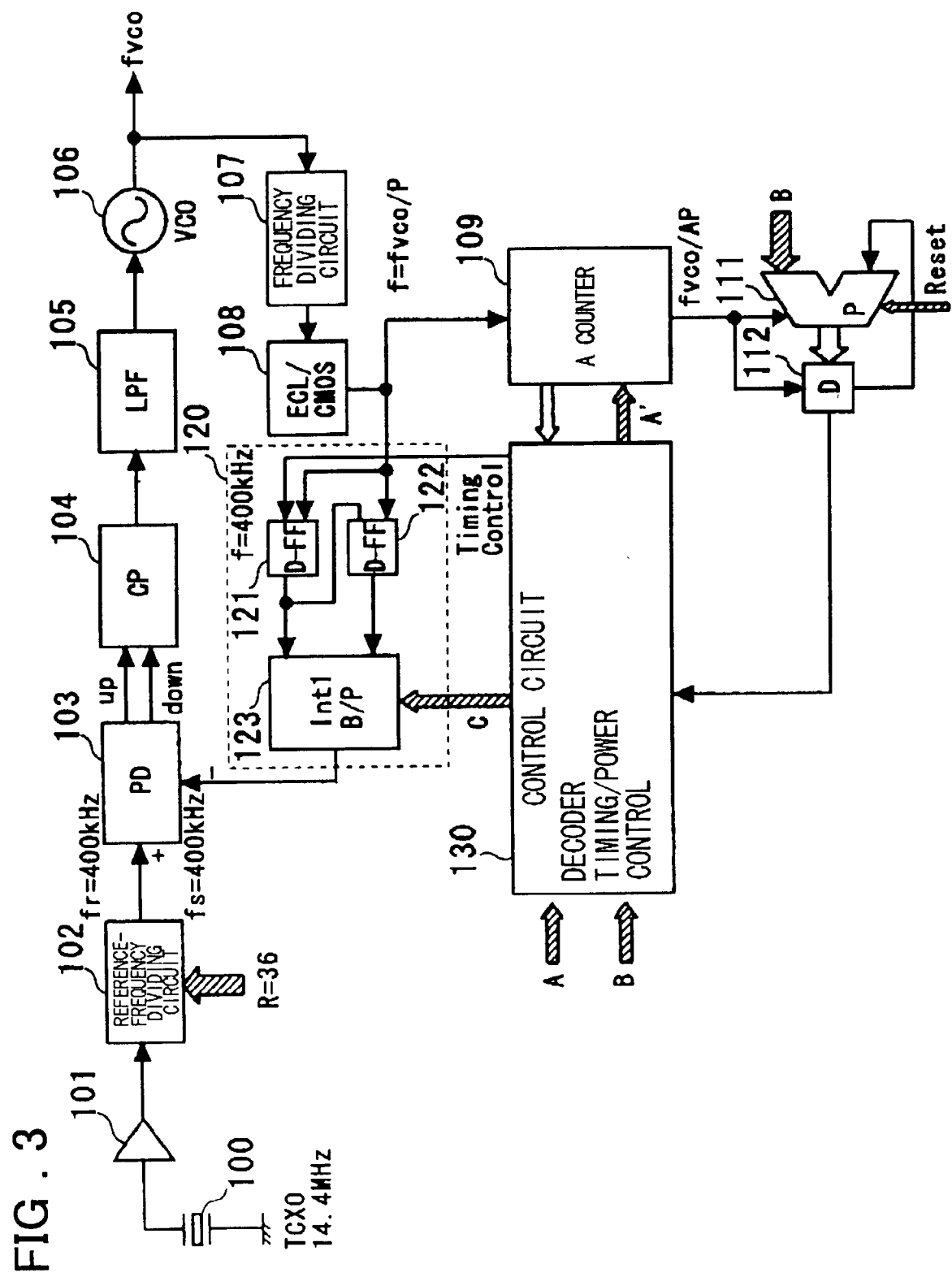
FIG. 3 is a block diagram illustrating the structure of a first embodiment according to the present invention.

In FIG. 3, the first embodiment shown in FIG. 1 is such that the frequency dividing circuit (prescaler) 107, which divides the output clock of the VCO 106 at high speed, is constituted by ECL (emitter-coupled logic), and an ECL/CMOS interface 108 is provided for converting between an ECL level and a CMOS level. An arithmetic unit constitutes the remainder calculating circuit 110 in FIG. 1 111 and latch 112.

The arithmetic unit 111 adds the constant B, which divides the interior division ratio of the interpolator 123, to the present value being held in the latch 112. If the sum becomes greater than P, the arithmetic unit 111 performs subtraction by P and outputs the value to the latch 112.

On the basis of the output of A counter 109, the control circuit 130 outputs the timing control signal whenever division by A is performed, namely the period at which interpolator 123 performs interpolation. In addition, the control circuit 130 decodes the remainder MOD (nB,P) from the remainder calculating unit 110 and outputs the control signal C (a binary parallel signal) so that the interpolator 123 performs interpolation at an interior division ratio corresponding to MOD (nB,P)/P.

Further, on the basis of the timing control signal (or power control signal, not shown) from the control circuit 130, and with regard to application of the P-frequency-divided output of the frequency dividing circuit (prescaler) 107 to the phase adjusting circuit 120, gate control is performed so as to activate a gate circuit and transmit the P-frequency-divided output for a predetermined period of time starting from a timing decided whenever the A counter A counter 109 divides by A. At times other than this period of time, supply of the P-frequency-divided clock from the ECL/CMOS circuit 108 is disabled to thereby control power consumption.

FIG. 4 is a block diagram illustrating the structure of a second embodiment according to the present invention. According to the second embodiment, the phase adjusting circuit, here designated by 120A, comprises three interpolators 123, 124, and 125, and circuits 113, 114 which calculate a remainder for fractional frequency division are provided in addition to the arithmetic circuit for integral frequency division N=A×P+B, whereby fractional frequency division is implemented.

In a manner similar to that of the above embodiment, the interpolator 123 is such that phase division changes by B/P at a time in steps of 1/P of one period of the P-frequency-divided output, based upon a control signal C2, whenever frequency-division by A is performed by the A counter 109. The interpolator 124 is such that phase division changes by B/P at a time in steps of 1/P of one period of the P-frequency-divided output, based upon a control signal C2, whenever frequency-division by A is performed by the A counter 109. Here the interior division ratio is (B+1)/P, which is a value larger than that of the interpolator 123 by one step.

The phase difference between the output signals of the interpolators 123, and 124 is 1/P taking the divide-by-P period as a reference.

The interpolator 125 outputs a signal whose phase is interpolated in steps obtained by further dividing the phase difference 1/P (equivalent to one period of the oscillating clock of VCO 106) between the outputs of interpolators 123, and 124 by M. The interpolator 125 adds K to C3 of the interior division ratio C3:M−C3 whenever interpolation is performed and sets the interior division ratio by the remainder obtained by dividing the sum by M.

The arithmetic unit (ALU) 111 and latch 112 calculate MOD (nB,P) whenever division by A is performed. More specifically, the arithmetic unit 111 adds B to the present value C2 held in the latch 112 each time division by A is performed. When the sum exceeds P, the arithmetic unit 111 outputs a value, which is obtained by subtracting P from the sum, to the latch 112 as the remainder MOD (nB,P).

An arithmetic unit (ALU) 113 and a latch 114 calculate MOD (nK,M). The arithmetic unit 113 adds K to the present value C3 held in the latch 114 each time division by A is performed. When the sum exceeds M, the arithmetic unit 113 outputs a value, which is obtained by subtracting M from the sum, to the latch 113 as the remainder MOD (nK,M).

On the basis of the output of A counter 109, the control circuit, here designated by 130A, outputs the timing control signal whenever division by AP is performed, namely at the period at which interpolator 123 performs interpolation. In addition, the control circuit 130A decodes MOD (nB,P) and outputs the control signal C2 so that the output phases of the interpolators 123 and 124 are incremented by B/P, (B+1)/P, respectively, with the period of division-by-P serving as the reference. The interior division ratios for interpolating phase difference in the interpolators 123, and 124 become C2:P−C2, and C2+1:P−(C2+1), respectively.

The control circuit 130A decodes MOD (nK,M) and outputs a control signal C in order to increment the output phase of interpolator 125 by K/M. The interior division ratio for interpolating phase difference in the interpolator 125 becomes C3:M−C3.

Thus, by generating a phase difference equivalent to the oscillation period of the VCO 106 and interpolating this phase difference in the interpolator 125, the output of the VCO 106 is subjected to programmable fractional division.

The phase adjusting circuit 120A interpolates the phase difference of the period of division by P in steps of 1/(M×P) with regard to the signal output from the interpolator 125, thereby implementing fractional division (A×P+B+K/M) of the oscillation frequency of VCO 106.

The fractionally divided signal output by the interpolator 125 is input to the phase comparator 103, thereby implementing fractional frequency multiplication and making it possible to perform phase adjustment every 1/M of the period of oscillation of VCO 106.

In this embodiment also the frequency dividing circuit 107 is constituted by a divide-by-P circuit. In other words, a dual-modulus control prescaler is not necessary even in this embodiment that realizes fractional frequency division. Such a prescaler can be replaced by a simple frequency dividing circuit.

In the above embodiments, only division by P is implemented, division by (P+1) is unnecessary and the scale of the circuitry of the high-speed prescaler can be reduced. Since a B counter is not required, it is possible to reduce power consumption.

Control of an MC signal for switching between divide by P and divide by P+1 is unnecessary, thereby facilitating timing design. A combination of integral division and fractional division also is facilitated. Furthermore, since control of an MC signal is unnecessary, the frequency dividing circuit (prescaler) 107 and control circuit 130A may be constructed on separate chips. This increases greatly the freedom of design.

The input to the phase comparator 103 comprises a signal [whose frequency fs is fvco/(AP+B+K/M)] obtained by frequency dividing the output clock (frequency=fvco) of the VCO 106 by a frequency-dividing factor AP+B+K/M at all times. The frequency spectrum basically is a single spectrum (the output signal of the interpolator (123). No spurious is produced.

An example of the structure of the interpolators 123, 124 and 125 used in these embodiments will be described. The structure described below makes it possible to variably set the phase of the output signal in steps obtained by dividing the phase difference of the two input signal by P based upon a control signal. Feedthrough current is inhibited. Such an arrangement is ideal for reducing power consumption.

Figure 5:
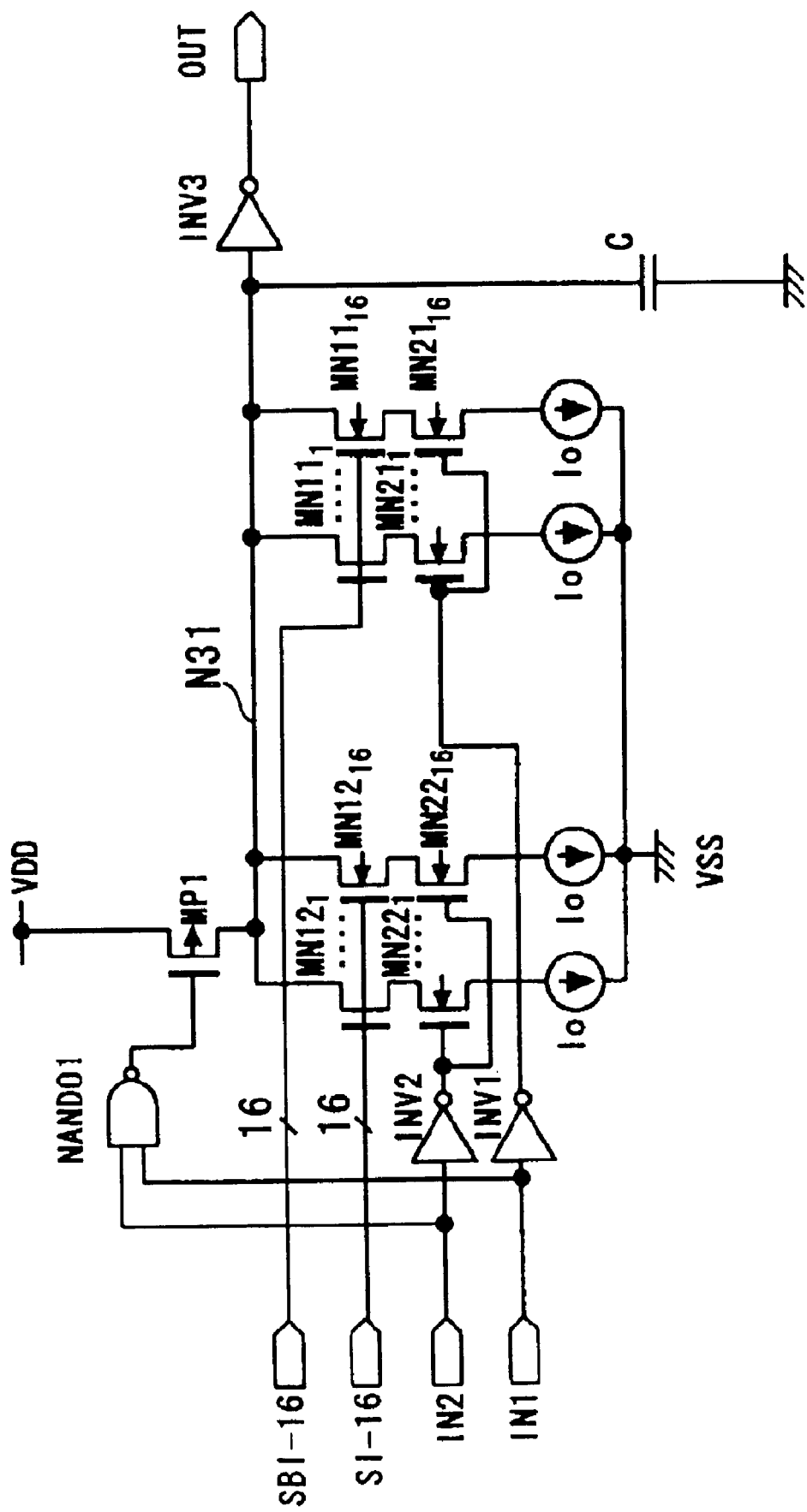
FIG. 5 is a diagram illustrating the structure of an interpolator used in the embodiments of the present invention.

As shown in FIG. 5, the interpolator comprises a NAND gate NAND01 having first and second input terminals IN1 and IN2 to which first and second input signal, respectively, are applied; a P-channel MOS transistor MP1 having its source connected to a power supply VDD and its drain to an internal node N31 and to the gate of which is input the output signal of the NAND gate NAND01; an inverter INV3 for switching the logic value of the output signal when the size relationship between the potential at the internal node and a threshold-value voltage changes; inverters INV1 and INV2 having first and second input terminals IN1 and IN2 to which the first and second input signals, respectively, are applied; 16 N-channel MOS transistors $MN11_1$ to $MN11_{16}$ the drains of which are connected in common with the internal node N31 and the gates of which are connected to control signals SB1 to SB16 (complementary signals of S1 to S16); 16 N-channel MOS transistors $MN12_1$ to $MN12_{16}$ the drains of which are connected in common with the internal node N31 and the gates of which are connected to the control signals S1 to S16, respectively; 16 N-channel MOS transistors (switch elements) $MN21_1$ to $MN21_{16}$ the drains of which are connected to the sources of the N-channel MOS transistors $MN11_1$ to $MN11_{16}$, respectively, the sources of which are connected to respective ones of constant-current sources $I_0$ at one end thereof and the gates of which are connected in common with the output of the inverter INV1; and 16 N-channel MOS transistors (switch elements) $MN22_1$ to $MN22_{16}$ the drains of which are connected to the sources of the N-channel MOS transistors $MN12_1$ to $MN12_{16}$, respectively, the sources of which are connected to respective ones of constant-current sources $I_0$ at one end thereof and the gates of which are connected in common with the output of the inverter INV2. The plurality of constant-current sources have their other ends connected in common with a power source VSS. Further, a capacitance C is connected between the internal node N31 and ground (GND). In FIG. 5, the control signals S1 to S16 and their complementary signals SB1 to SB16 correspond to the control signal C that enters the interpolator 123 from the control circuit 130 in FIG. 1.

The operation of internally dividing the timing difference will be described for a case where N-number of the 16 parallel-connected N-channel MOS transistors are turned on by input signal IN1 (where N is 0 to 16, N=0 means that no transistors turn on and N is decided by the control signals S1 to S16, SB1 to SB16), and (16-N)-number of the N-channel MOS transistors are turned on by input signal IN2 after a time T, so that a total of N+(16−N)=16 N-channel MOS transistors are turned on.

Let the current that flows into one of the parallel N-channel MOS transistors of the interpolator be I (the current value of the constant-current source $I_0$), let the threshold-value voltage at which the output of the inverter INV3 is inverted be V, and let CV represent the amount of variation in electric charge up to the threshold-value voltage V.

Assume that the input signals IN1, IN2 are both at HIGH level, that the output of the NAND gate NAND01 is at LOW level and that the internal node N31 is in a state in which it has been charged from the side of power supply VDD side via the P-channel MOS transistor MP1. An instance where the input signals IN1 and IN2 fall to LOW level under these conditions will now be described.

First, at N=16, assume that all 16 of the control signals SB1 to SB16 are at HIGH level and that all of the control signals S1 to S16 are at LOW level. When the input signal IN1 falls to LOW level, the 16 parallel N-channel MOS transistors $MN11_1$ to $MN11_{16}$ turn on and all of the N-channel MOS transistors $MN22_1$ to $MN22_{16}$ turn off. Then, if the input signal IN2 falls to LOW level and the output of the inverter INV2 rises to HIGH level after time T, the 16 parallel N-channel MOS transistors $MN22_1$ to $MN22_{16}$ turn [(IN−16)=0]. Accordingly, if N=16 holds, with I as the current of the constant-current sources $I_0$, the time T(16) from the moment the input signal IN1 falls to LOW level to the moment the output of the inverter INV3 is inverted is given by the following equation:

$$T(16)=CV/(16 \cdot I) \qquad (1)$$

If N=n (n<16) holds (n is set by the control signal C), n-number of N-channel MOS transistors $MN21_1$ to $MN21_n$ to the gates of which the inverted signal of the input signal IN1 is applied turn on for the time T (where T is the timing difference between falling edges of the input signals IN1 and IN2) after the input signal IN1 falls to LOW level, as a result of which an electric charge equivalent to n·I·T is discharged. Next, in response to the input signal IN2 falling to LOW level, (16−n)-number of N-channel MOS transistors $MN22_1$ to MN22$_{16-n}$ to the gates of which the inverted signal of the input signal IN2 is applied turn on. Hence, a total of 16 N-channel MOS transistors turn on and the output of the inverter INV3 is inverted (changes from HIGH level to LOW level) at the moment (time T') the electric charge (CV–n·I·T) that remains at the internal node N31 is discharged by 16·I. The time T' is given by the following equation:

$$T' = (CV - n \cdot I \cdot T)/(16 \cdot I) \qquad (2)$$

Accordingly, the time T(n) from the moment the input signal IN1 falls to LOW level to the moment the output of the inverter INV3 is given by the following:

$$T(n) = (CV - n \cdot I \cdot T)/(16 \cdot I) + T \qquad (3)$$
$$= CV/(16 \cdot I) - (n/16)T + T$$
$$= T(16) + (16-n)/16 \cdot T$$

Depending upon the value of n, there is obtained an output signal having a phase obtained by interpolating the phase difference (timing difference T) between the first and second input signals at an interior division ratio n:(16–n) in steps of 16 equal portions of the phase difference. More specifically, by setting the control signal (the control signal C of FIG. 1, referred to also as a "weighting signal") that decides the interior division ratio, there is obtained an output signal of any phase obtained by dividing the timing difference between the input signals IN1 and IN2 at a resolution of 1/16 by varying n. Such an interpolator is referred to also as a "16-step interpolator".

In general, when an interpolator is a P-step (where P is any positive integer) interpolator, P-number of each of the N-channel MOS transistors MN11, MN12, MN21 and MN22 are disposed in parallel.

The interpolator shown in FIG. 5 is such that the internal node N31 is charged to the power-supply potential when the input signals IN1, IN2 are both at HIGH level. When the input signals IN1, IN2 make a negative-going transition from the high to LOW level, the internal node N31 is discharged and the output signal rises from the low to HIGH level. However, an arrangement may be adopted in which the output signal rises from the low to HIGH level in response to a positive-going transition of the input signals from the low to HIGH level. In order to obtain logic in which the output signal falls from the high to LOW level in response to a negative-going transition of the input signals IN1, IN2 from the high to LOW level, the inverter INV3, which is an inverting buffer, should be made a non-inverting buffer.

Figure 6:
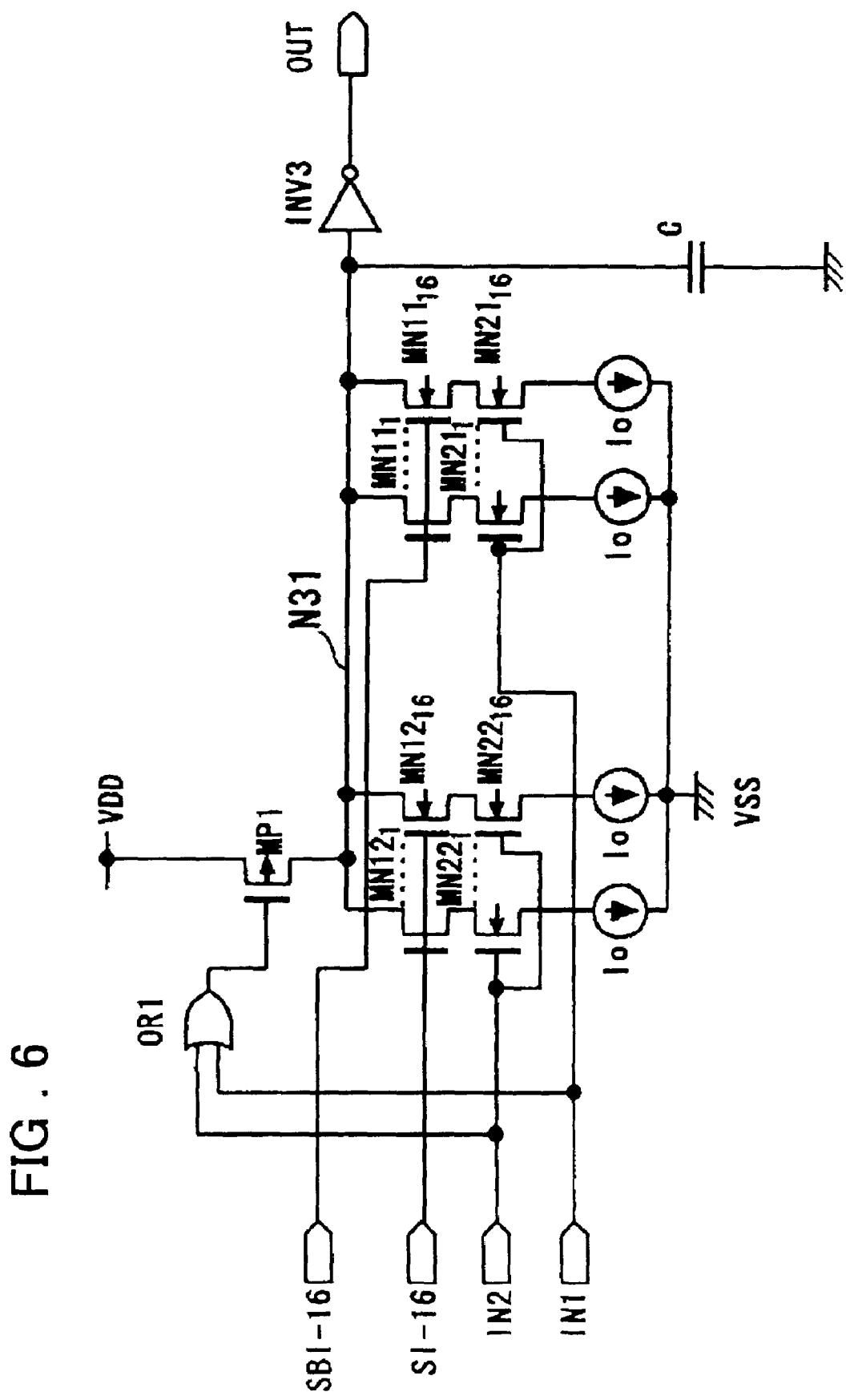
FIG. 6 is a diagram illustrating the structure of an interpolator used in the embodiments of the present invention.

FIG. 6 illustrates an example of the circuitry of the interpolator for outputting a rising signal upon dividing the timing difference between edges making a positive-going transition from the low to HIGH level of input signals. As shown in FIG. 6, the interpolator comprises the P-channel MOS transistor MPi having its source connected to the power supply and its drain to the internal node N31 and to the gate of which is input the output signal of an OR gate OR1 to the first and second input terminals IN1 and IN2 of which the first and second input signals, respectively, are applied; an inverter INV3 for switching the logic value of the output signal when the size relationship between the potential at the internal node and a threshold-value voltage changes; 16 N-channel MOS transistors MN11$_1$ to MN11$_{16}$ the drains of which are connected in common with the internal node N31 and the gates of which are connected to the control signals SB1 to SB16, respectively; 16 N-channel MOS transistors MN12$_1$ to MN12$_{16}$ the drains of which are connected in common with the internal node N31 and the gates of which are connected to the control signals S1 to S16; 16 N-channel MOS transistors (switch elements) MN21$_1$ to MN21$_{16}$ the drains of which are connected to the sources of the N-channel MOS transistors MN11$_1$ to MN11$_{16}$, respectively, the sources of which are connected to respective ones of constant-current sources I$_0$ and the gates of which are connected to the first input terminal IN1; and 16 N-channel MOS transistors (switch elements) MN22$_1$ to MN22$_{16}$ the drains of which are connected to the sources of the N-channel MOS transistors MN12$_1$ to MN12$_{16}$, respectively, the sources of which are connected to respective ones of constant-current sources I$_0$ and the gates of which are connected to the first input terminal IN1.

Figure 8:
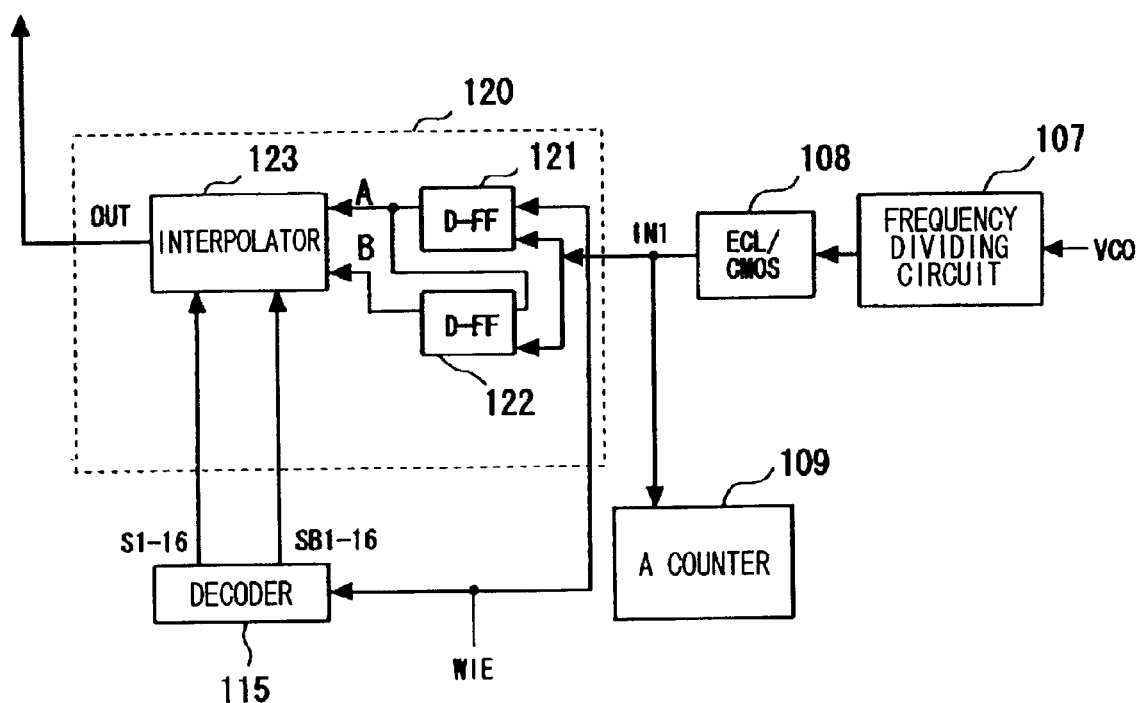
FIG. 8 is a block diagram illustrating the structure of the first embodiment.

Rather than using the capacitance C shown in FIG. 8, an arrangement may be adopted in which a plurality of series circuits (transistor MN31 and capacitor C1, transistor MN32 and capacitor C2, transistor MN 33 and capacitor 3, transistor MN 34 and capacitor C4, and transistor MN35 and capacitor C5), each of which comprises a switch element constituted by an N-channel MOS transistor and a capacitor, are connected in parallel between the internal node N31 and ground, and the switch elements (transistors MN31, MN32, MN33, MN34, and MN35) are turned on and off based upon a capacitor selection signal supplied to the control terminals of the switch elements (transistors MN31, MN32, MN33, MN34, MN35), whereby a capacitance C applied to the internal node N31 is set programmably.

Figure 7:
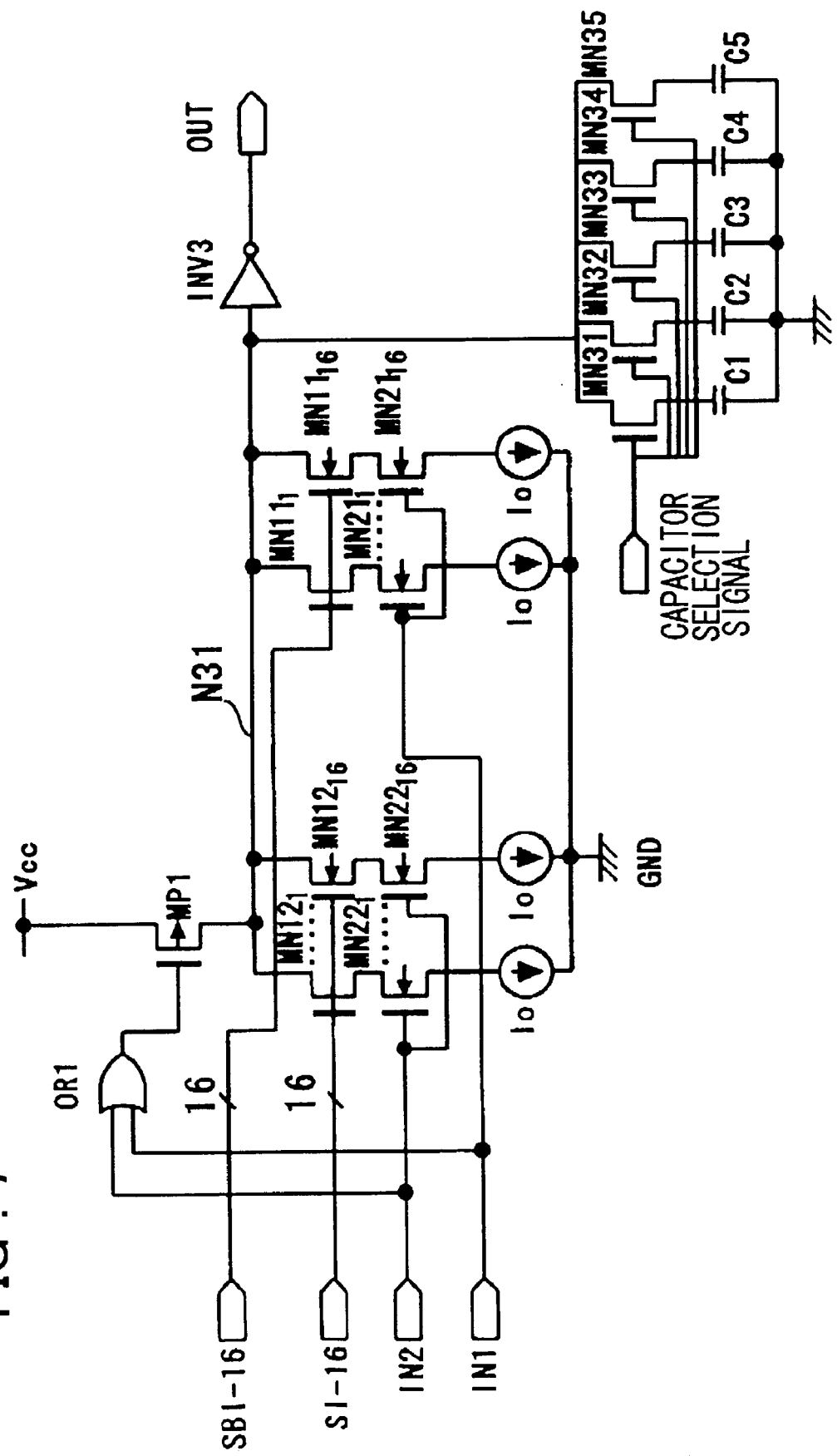
FIG. 7 is a diagram illustrating the structure of an interpolator used in the embodiments of the present invention.

In the arrangements of FIGS. 5, 6 and 7, the positions of the N-channel MOS transistors MN11 and MN12 and of the N-channel MOS transistors MN12 and MN22 may be reversed. More precisely, the drains of N-channel MOS transistors MN21$_1$ to NM21$_{16}$, gates of which are connected in common to the output of the inverter INV1, may be connected in common to the internal node N31 and the drains and sources of the N-channel MOS transistors MN11$_1$ to NM11$_{16}$, gates of which are connected to the control signal terminals SB1–16, are connected to sources of the N-channel MOS transistors MN21$_1$ to NM21$_{16}$ respectively and the ground in common. The drains of N-channel MOS transistors MN22$_1$ to NM22$_{16}$, gates of which are connected in common to the output of the inverter INV2, may be connected in common to the internal node N31 and the drains and sources of the N-channel MOS transistors MN12$_1$ to NM12$_{16}$, gates of which are connected to the control signal terminals S1–16, are connected to sources of the N-channel MOS transistors MN22$_1$ to NM22$_{16}$ respectively and the ground in common.

Further, the control signals (weighting signals) SB1–16 may be signals obtained by inverting the signals S1–16 using an inverter.

The interpolators 123, 124 and 125 shown in FIG. 4 also employ an interpolator similar to that described with reference to FIGS. 5 to 7.

FIG. 8 is a block diagram illustrating an example of the circuit structure surrounding the phase adjusting circuit 120 of FIG. 1. A 16-step interpolator in the manner shown in FIGS. 5 and 6 constitutes the interpolator 123. In the example of FIG. 8, it is assumed that the frequency dividing circuit 107 divides the oscillation frequency of the VCO by 16 and outputs a divided signal IN1.

On the basis of the count output from the A counter 109 and the cumulative result from arithmetic unit 111 (the output of latch 112), the control circuit 130 generates a control signal supplied to the interpolator 123. When division by AP is performed, the control circuit 130 makes a timing control signal WIE active at a predetermined timing and outputs the active signal to the data input terminal of the D-type flip-flop 121.

The decoder 115 of the control circuit 130 decodes C=MOD(nB,P), generates 16-bit parallel control signals S1 to S16 and their inverted signals SB1 to SB16, which decide the interior division ratio, and outputs these signals to the interpolator 123. If the interpolator 123 is a 16-step interpolator and B is 3, then the interior division ratio C:P–C of the interpolator 123 changes successively in the manner 0:16, 3:13, 6:10, 9:7, 12:4, 15:1, 2:14, 5:11, 8:8, 11:5, 14:2, 1:15, 4:12, 7:9, 10:6, 13:3, 0:16, and the decoder 115 converts "3" to "0000000000000111".

Figure 9:
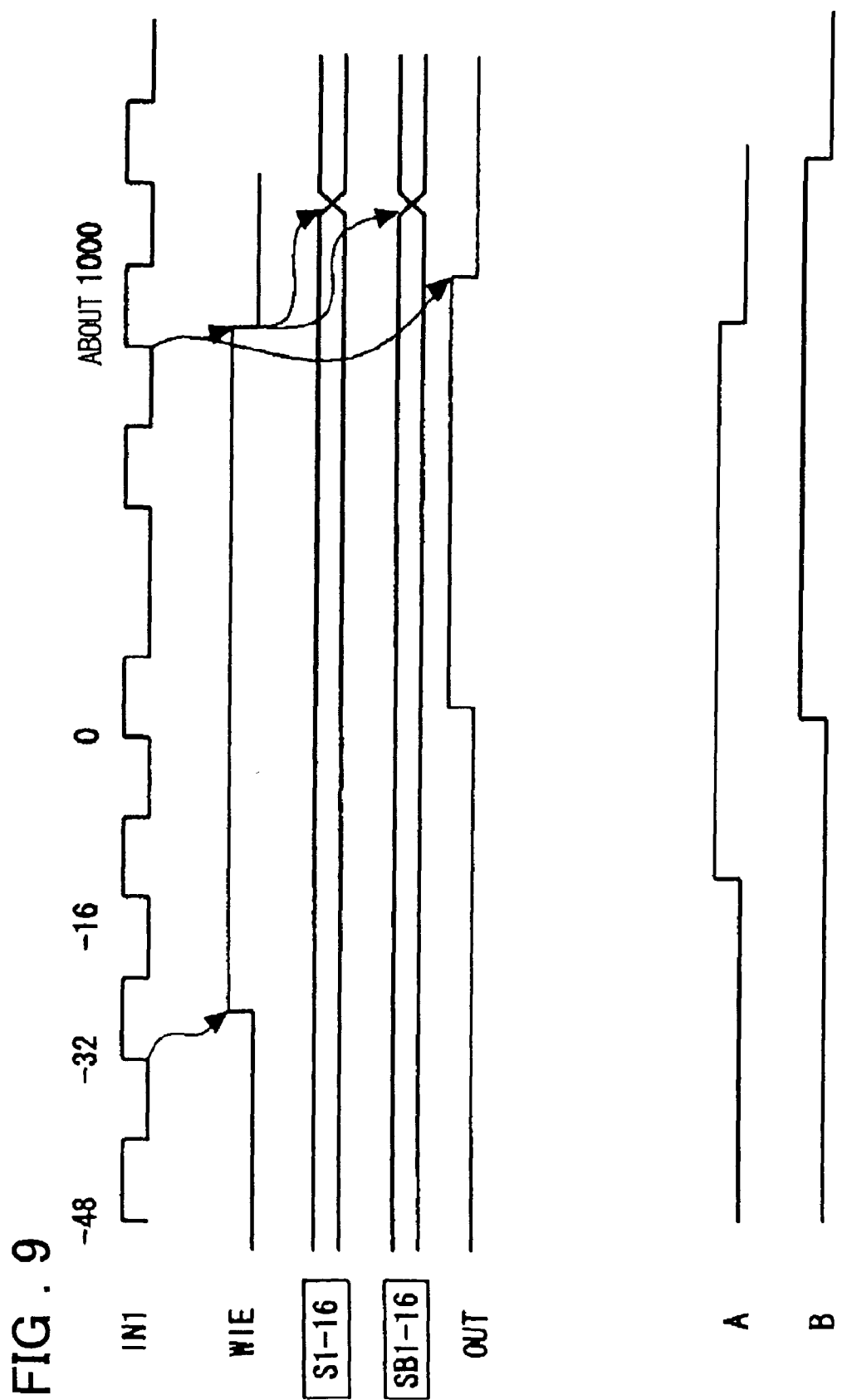
FIG. 9 is a diagram useful in describing the timing operation of the first embodiment.

As shown in FIG. 9, the control circuit 130 activates the timing control signal WIE at the rising edge of the signal IN1 (the output signal of the ECL/CMOS interface 108 in FIG. 8)) that corresponds to a $-32^{nd}$ VCO output clock in FIG. 9 and deactivates the signal WIE in response to the signal IN1 corresponding approximately to the $1000^{th}$ clock. The D-type flip-flop 121, to the data input terminal of which HIGH level signal WIE is applied, latches the signal WIE and outputs the signal A at the rising edge of the signal IN1 corresponding to the $-16^{th}$ VCO output clock. The D-type flip-flop 122, the input to which is the output A of the D-type flip-flop 121, latches the signal and outputs the signal B at the rising edge of the signal IN1 corresponding to the $-16^{th}$ VCO output clock. The interpolator 123 generates and outputs a signal OUT having a phase obtained by interpolating the timing difference (which corresponds to a period generated by D-type flip-flops 121, 122 and divided by 16 in the frequency dividing circuit (107) between the signals A and B at an interior division ratio decided by the control signals S1 to S16, SB1 to SB16 supplied from the decoder 115.

The interpolator 123 operates and outputs the signal OUT whenever the A counter 109 performs division by A. As a result, the setting of the control signal from the decoder 115 in the interpolator 123 is carried out when the interpolator 123 does not operate.

Described next will be the details of the process through which the control circuit 130 (130A) of this embodiment generates the control signal applied to the interpolator in the phase adjusting circuit 120 (120A).

[1] In Case of Integral Division N=AP+B

Figure 10:
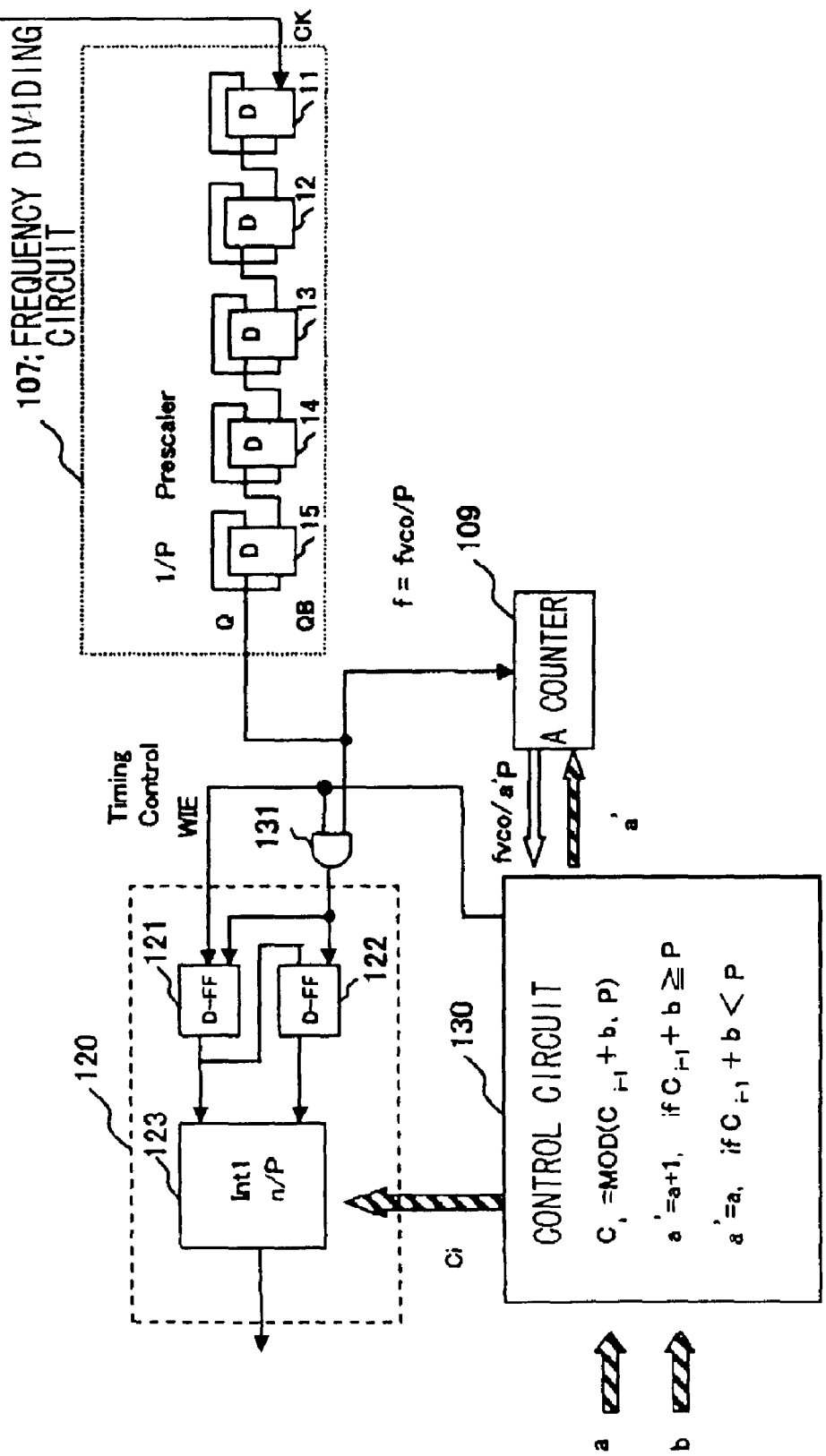
FIG. 10 is diagram useful in describing the operation of the control circuit according to the first embodiment.

FIG. 10 is a diagram useful in describing the control operation of the control circuit 130 shown in FIG. 1. In FIG. 10, it is assumed that the remainder calculating unit 110 of FIG. 1 is contained in the control circuit 130.

As shown in FIG. 10, the frequency dividing circuit prescaler) 107 includes D-type flip-flops 12, 13, 14 and 15, which construct divide-by-2 frequency dividers, and a D-type flip-flop 11 that constructs a divide-by-2 frequency divider. The D-type flip-flops 12, 13, 14 and 15 feed the output of the inverting output terminal back to the data input terminal, with the output of the data output terminal of the preceding D-type flip-flop being input to the clock input terminal. The D-type flip-flop 11 feeds the output of its inverting output terminal back to its data input terminal and has the output clock of the VCO 106 input to its clock input terminal.

The timing control signal WIE output from the control circuit 130 is input to an AND gate 131 together with the divided output of the frequency dividing circuit 107. The P-frequency-divided output of the frequency dividing circuit 107 is input to the clock input terminals of the D-type flip-flops 121 and 122 of phase adjusting circuit 120 via the AND gate 131 only when the timing control signal WIE is at HIGH level. When the timing control signal WIE is at LOW level, the AND gate 131 outputs a low-level signal and the P-frequency-divided output of the frequency dividing circuit 107 is not transmitted to the D-type flip-flops 121 and 122 of the phase adjusting circuit 120. In other words, the D-type flip-flops 121 and 122 are not supplied with the clock, the interpolator 123 does not operate and less power is consumed. It should be noted that the ECL/CMOS interface 108 in FIG. 2 is omitted from FIG. 10.

Whereas the period (frequency-dividing factor) of the output signal of the main frequency divider constituted by the frequency dividing circuit 107 and phase adjusting circuit 120 is a×P+b (where remainder b<P holds), the output period of the A counter 109 is a×P or (a+1)×P.

In this embodiment, the interpolator 123 implements division of the period of its output signal by a×P+b by making one period of the output of frequency dividing circuit (prescaler) 107 longer than a×P by the remainder b. Whenever the A counter 109 divides by a, the interpolator 123 adjusts the phase of the output of frequency dividing circuit 107 by outputting a signal obtained by adding on the phase of the interior division ratio b/P. The relationships involving the phase of the output signal of interpolator 123 can be expressed by Equation (4) below.

$C_i$=MOD($C_{i-1}$+b,P)

a'=a+1, if $C_{i-1}$+b≧P a'=a, if $C_{i-1}$+b<P     (4)

In Equation (4) above, $C_i$=MOD ($C_{i-1}$+b,P) is the interior division ratio, $C_{i-1}$ is the interior division ratio of the preceding period (at the time of the preceding interpolation operation), and a' is the frequency-dividing factor of the A counter 109.

MOD (p,q) is an operator that represents the remainder r obtained by dividing p by q and corresponds to the remainder calculating circuit 110 (arithmetic circuit 111 and latch 112 in FIG. 3) of FIG. 1. In this case, B that is input to the arithmetic circuit 111 corresponds to b, the remainder MOD ($C_{i-1}$+b,P) that is the result of dividing by P the value obtained by adding b to the value $C_{i-1}$ held in the latch 112 is held in latch 112 as the present value $C_i$ of the interior division ratio, and the present value $C_i$ of the interior division ratio is supplied to the interpolator 123 as the control signal C.

The interior division ratio of the interpolator 123, which divides the phase difference between the first and second input signals in steps of P, becomes $C_i$:(P–$C_i$), b is added to the preceding value $C_{i-1}$ of the interior division ratio whenever division by a' is performed (i.e., every period), and the remainder that is the result of dividing the sum by P becomes the present value $C_i$. If the value $C_{i-1}$+b, which is obtained by adding b to the preceding value $C_{i-1}$ of the interior division ratio, is equal to or greater than the frequency-dividing factor P of the frequency dividing circuit 107, the control circuit 130 sets a value obtained by adding 1 to the frequency dividing factor A of the A counter 109, the A counter 109 divides by a+1 and this period is made longer than the one period for the case where division was performed originally by a.

If the value $C_{i-1}$+b, which is obtained by adding b to the preceding value $C_{i-1}$ of the interior division ratio, is less than the frequency-dividing factor P of the frequency dividing circuit 107, then the frequency-dividing factor of the A counter 109 is left at a and the period of the main frequency divider is made larger than a×P.

The period of the signal output whenever interpolation of phase is performed by the interpolator 123 is given by the following equations:

If $C_{i-1}+b \geq P$ holds, then $\{(a+1)P+(C_i/P)P\}-(C_{i-1}/P)$
$P=(a+1)P+(C_{i-1}+b-P)/P)P-(C_{i-1}/P)P=aP+b$ (5)

$C_{i-1}+b<P$ holds, then $\{aP+(C_i/P)P\}-(C_{i-1}/P)P=aP+$
$(C_{i-1}+b)/P)P-(C_{i-1}/P)P=aP+b$ (6)

By virtue of the above-described control operation, the period of the output signal of interpolator 123 is aP+b at all times and any frequency-dividing factor can be implemented. In this case, the output period of the frequency dividing circuit 107 is divided equally by P in the interpolator 123.

[2] In Case of Fractional Division N=AP+B+K/M

Fractional division of frequency will be described next. With respect to one period of the P-frequency-divided output of the frequency dividing circuit (prescaler) 107, updating of phase of the signal interpolated and output by the interpolator 123 is performed in steps of b/P (where b is a positive integer that is less than P).

If K/M is added to b to obtain b+K/M (where M, K are positive integers and K<M holds), the step for updating the phase of the signal interpolated and output by the interpolator 123 (i.e., the difference between the present phase and preceding phase of the interpolated and output signal) becomes as follows:

$(b+K/M)/P=(b \times P+K)/(P \times M)$

In this case, the period of the output signal of interpolator 123 is a×P+b+K/M (where b<P, K,M hold).

The output period of the A counter 109 is a×P or (a+1)×P.

In this embodiment, the interpolator 123 implements division of the period of its output signal by a×P+b+K/M by making one period of the output of frequency dividing circuit (prescaler) 107 longer than a×P by the remainder b+K/M at every period in which the interpolation operation is carried out. As a result, whenever the A counter 109 divides by a, a correction is performed to add (bP+K) to the interior division ratio of interpolator 123 whose input is the output of the frequency dividing circuit (prescaler) 107. In other words, updating of phase at the time of interpolation by the interpolator 123 is performed in steps of (bP+K)/(P× M). The period of the output signal whenever the interpolator 123 interpolates phase is given by Equation (7) below. It should be noted that bM and PM represent b×M and P×M, respectively.

$C1_i=\text{MOD}(C1_{i-1}+bM+K,PM)$ $a'=a+1$, if $C1_{i-1}+bM+K \geq PM$ $a'=a$, if $C1_{i-1}+bM+K<PM$ (7)

where $C_i=\text{MOD }(C1_{i-1}+bM+K,PM)$ is the interior division ratio, $C1_{i-1}$ is the interior division ratio of the preceding period, and a' is the frequency-dividing factor of the A counter 109.

The operation of performing fractional division will be described with reference to FIG. 10. The interior division ratio of the interpolator 123 is $C1_i:(P-C1_i)$, b×M+K is added to the preceding value $C1_{i-1}$ of the desired voltage every period (at the divide-by-a' period, namely whenever the interpolation operation is performed), and the remainder obtained by dividing the result of addition by P×M becomes $C1_i$.

If the value $C1_{i-1}+b\times M+K$, which is obtained by adding b×M+K to the preceding value $C1_{i-1}$ of the interior division ratio, is equal to or greater than M×P, which is the result of multiplying the frequency-dividing factor P of the frequency dividing circuit 107 by M, then 1 is added to the frequency dividing factor A of the A counter 109 and this period is made larger than one period in the case of the original frequency-dividing factor a.

If the value $C1_{i-1}+bM+K$, which is obtained by adding bM+K to the preceding value $C1_{i-1}$ of the interior division ratio, is equal to or greater than the frequency-dividing factor P of the frequency dividing circuit 107, then the frequency-dividing factor of the A counter 109 is left at a. The period of the signal output whenever interpolation of phase is performed by the interpolator 123 is given by the Equations (8) and (9) below. In the Equations (8), and (9), aP, (a+1)P, bM and PM represent a×P, (a+1)×P, b×M and P×M, respectively.

If $C1_{i-1}+bM+K \geq PM$ holds, then $\{(a+1)P+(C1_i/PM)$
$P\}-(C1_{i-1}/PM)P=\{(a+1)P+((C1_{i-1}+bM+K-PM)/$
$PM)P\}-(C1_{i-1}/PM)P=aP+b+K/M$ (8)

$C1_{i-1}+bM+K<PM$ holds, then $\{aP+(C_i/PM)P\}-(C_{i-1}/$
$PM)P=\{aP+((C1_{i-1}+bM+K)/PM)P\}-(C1_{i-1}/PM)$
$P=aP+b+K/M$ (9)

By virtue of the above-described control operation, the period of the output signal of interpolator 123 is aP+b+K/M at all times and any fractional frequency-dividing factor can be implemented.

In this case, the output period of the frequency dividing circuit 107 is divided equally by P×M in the interpolator 123. An interpolator of the kind shown in FIGS. 5 to 7 that inhibits feedthrough current is used as the interpolator. However, as long as the interior division ratio can be implemented accurately, another circuit arrangement may be adopted for the interpolator.

It is required that phase difference be divided equally by P×M (that the step be P×M) in one interpolator, as a result of which the scale of the interpolator circuitry increases. For example, in FIG. 5, it is required that each of the parallel-connected N-channel MOS transistors 11, 12, 21 and 22 be P×M in number, result in circuitry of large scale. The control signals (S1 to S16 and SB1 to SB16) also require 2×P×M wiring lines and the decoder (115 in FIG. 8) also become a circuit of large scale.

[3] In Case of Fractional Division N=AP+B+K/M

The scale of the circuitry can be reduced by adopting a two-stage arrangement of the kind shown in FIG. 11 as the interpolator of phase adjusting circuit 120. The arrangement shown in FIG. 11 corresponds to the arrangement of the embodiment illustrated in FIG. 4 and includes the first and second interpolators 123 and 124 for producing output signals of phases obtained by internally dividing the phase difference of the P-frequency-divided period at interior division ratios $C2_i$ and $C2_i+1$, respectively; and the interpolator 125 for producing an output signal of a phase obtained by performing the interior division of the phase difference 1/P of the output signals of the first and second interpolators at the interior division ratio $C3_i$ (where the division number of the phase difference is M).

Updating of phase of the signal interpolated and output by the phase adjusting circuit 120A having the two-stage interpolator of FIG. 11 is performed in steps of $(b+K/M)/P=(b\times P+K)/(P\times M)$ (where the step is the difference between the present phase and preceding phase of the interpolated and output signal).

In this case, both the period of the output signal of phase adjusting circuit 120A and the output period of the A counter 109 are equal to the fractionally divided period described with reference to FIG. 10. That is, whereas the period of the output signal of interpolator 125 is $$a\times P+b+K/M (b<P, K<M)$$

the output period of the A counter 109 is $a\times P$ or $$(a+1)\times P.$$

At every period of the output signal of interpolator 125, division by $a\times P+b+K/M$ is implemented by making one period of the output of frequency dividing circuit 107 longer than $a\times P$ by the remainder $b+K/M$ at all times. As a result, whenever the A counter 109 divides by a, the P-frequency-divided output of the frequency dividing circuit 107 is subjected to a correction by adding on a phase obtained by internally dividing the output by the interpolator at the interior division ratio $(bP+K)/(P\times M)$. If the relationship concerning the phase ratio is expressed by an equation, the following equation is obtained:

$$C1_i = \text{MOD}(C1_{i-1}+bM+K, PM)$$

$$a' = a+1, \text{ if } C1_{i-1}+bM+K \geq PM$$

$$a' = a, \text{ if } C1_{i-1}+bM+K < PM \tag{10}$$

where $C_i = \text{MOD}(C1_{i-1}+bM+K, PM)$ is the interior division ratio, $C1_{i-1}$ is the interior division ratio of the preceding period, and $a'$ is the frequency-dividing factor of the A counter 109.

In a case where the phase adjusting circuit 120A having the two-stage interpolator structure is constituted by an interpolator that divides the P-frequency-divided period equally by P and an interpolator that divides the P-frequency-divided period equally by M and division equally by P is carried out by the interpolator of the initial stage, then the interpolator of the succeeding stage performs division equally by M.

The initial stage is composed of the two interpolators 123 and 124 arranged in parallel, the interior division ratios of which are $C2_i:P-C2_i$ and $(C2_i+1):P-(C2_i+1)$ [where $0<C2_i<(P-1)$ holds], respectively. The interior division ratio of interpolator 125 of the next stage is $C3_i:M-C3_i$ (where $0<C3_i<M$ holds).

Here $C2_i$ is an integer obtained by dividing $C1_i$ by M, and $C3_i$ is a remainder obtained by dividing $C1_i$ by M. In other words, we have $$C2_i = \text{INT}(C1_i/M)$$

$$C3_i = \text{MOD}(C1_i, M) \tag{11}$$

The operation of this circuit will now be described.

The total interior division ratio of the phase adjusting circuit 120A is $C1_i:(P-C1_i)$, $b\times M+K$ is added to the preceding value $C1_{i-1}$ of the interior division ratio every period, and the remainder obtained by dividing the result of addition by $P\times M$ is $C1_i$.

If the value $C1_{i-1}+b\times M+K$ obtained by adding $b\times M+K$ to the preceding value $C1_{i-1}$ of the interior division ratio is greater than $P\times M$, which is the value obtained by multiplying the frequency-dividing factor P of frequency dividing circuit 107 by M, then 1 is added to the frequency dividing factor A of the A counter 109 so that division by $(a+1)$ is performed. If the value $C1_{i-1}+b\times M+K$ obtained by adding $b\times M+K$ to the preceding value $C1_{i-1}$ of the interior division ratio is greater than the frequency-dividing factor P of the frequency dividing circuit 107, then the frequency-dividing factor of the A counter 109 is left at a.

The quotient $C2_i$ and remainder $C3_i$ obtained by dividing $C1_i$ by M are found, and signals are obtained by interpolating two signals (that are output from the D-type flip-flops 121 and 122), which have a phase difference (P/fvco) of one period of the P-frequency-divided output of the frequency dividing circuit 107, from two successive pulses of the P-frequency-divided output of the frequency dividing circuit 107 by the two interpolators 123 and 124, respectively, based upon interior division ratios $C2_i:P-C2_i$ and $C2_i+1:P-(C2_i+1)$, respectively.

The phase difference between the outputs of the two interpolators 123 and 124 of interior division ratios 2Ci and 2Ci+1 become 1/P of the phase difference (=P/fvco) of one period of the frequency dividing circuit 107, namely a phase difference of 1/fvco. The interior division ratio of the interpolator 125 to which these two signals having this phase difference are input is made $C3_i:M-C3_i$, and the interpolator 125 produces an output signal C3OUT obtained by interpolating the phase difference 1/fvco in accordance with the interior division ratio $C3_i:M-C3_i$.

The interior division ratios for the frequency dividing circuit formed by combining the interpolator of the initial stage and the interpolator of the succeeding stage are $(C2_i/P)$ for the initial stage and $(3C_i/PM)$ for the succeeding stage. Accordingly, the following equation holds in view of $C2_i=\text{INT}(C1_i/M)$, $C3_i=\text{MOD}(C1_i,M)$.

$$(C2_i/P)+(C3_i/PM)=(\text{INT}(C1_i/M)/P)+(\text{MOD}(C1_i,M)/PM)=\{(\text{INT}(C1_i/M)+(\text{MOD}(C1_i,M)/M)\}/P=(C1_i/M)/P=C1_i/MP \tag{12}$$

Accordingly, the period of the output signal C3OUT of interpolator 125 is equal to that in the case of [2] above and is expressed by Equations (13), (14) below. In the Equations (13), and (14), aP, (a+1)P, bM and PM represent $a\times P$, $(a+1)\times P$, $b\times M$ and $P\times M$, respectively.

If $C1_{i-1}+bM+K \geq PM$ holds, then $\{(a+1)P+(C1_i/PM)P\}-(C1_{i-1}/PM)P = aP+b+K/M$ (13)

If $C1_{i-1}+bM+K<PM$ holds, then $\{aP+(C_i/PM)P\}-(C_{i-1}/PM)P=aP+b+K/M$ (14)

Accordingly, the period of the output signal of interpolator 125 is $aP+b+K/M$ at all times and any fractional frequency-dividing factor can be implemented. In this case, the output period of the frequency dividing circuit 107 is divided equally by PM in the interpolator. An interpolator of the kind shown in FIGS. 5 to 7, for example, is utilizable as the interpolator in this arrangement. However, as long as the interior division ratio can be implemented accurately, another circuit arrangement may be adopted for the interpolator.

[4] In Case of Fractional Division

Though the size of the interpolator is reduced by adopting a two-stage hierarchy for the interpolator in FIG. 11, the control circuit 130A is increased in size. Accordingly, in this embodiment, the control circuit of the interpolator is hierarchically arranged in a manner similar to that of the interpolator to reduce the scale of the circuitry. FIG. 12 is a diagram illustrating the structure of this embodiment. Here the control circuit, which is designated by 130B, has a two-stage structure in conformity with the two-stage structure of the interpolator.

Updating of phase of the signal interpolated and output by a phase adjusting circuit 120B having the two-stage interpolator of FIG. 12 is performed in steps of (b+K/M)/P=(b×P+K)/(P×M) (where the step is the difference between the present phase and preceding phase of the interpolated and output signal).

Whereas the period of the output signal of phase adjusting circuit 120B is a×P+b+K/M (b<P, K<M), the output period of the A counter 109 is a×P or (a+1)×P.

At every period of the output signal of phase adjusting circuit 120B, division by a×P+b+K/M is implemented by making one period of the output of frequency dividing circuit 107 longer than a×P by the remainder b+K/M at all times. As a result, whenever the A counter 109 divides by a, a phase obtained by internally dividing the period of the P-frequency-divided output of the frequency dividing circuit 107 by the interpolator at the interior division ratio (bP+K)/(P×M) is added on. The foregoing is the same as [2] and [3] above.

In this embodiment, the structure of the control circuit 130B is made to conform to the two-stage structure of the interpolator. Control of the interior division ratio in the control circuit 130B is expressed by equations (15), and (16) below.

$$C4_i = MOD(C4_{i-1}+K, M)$$

$$b' = b+1, \text{ if } C4_{i-1}+K \geq M$$

$$b' = b, \text{ if } C4_{i-1}+K < M \quad (15)$$

$$C5_i = MOD(C5_{i-1}+b', P)$$

$$a' = a+1, \text{ if } C5_{i-1}+b' \geq P$$

$$a' = a, \text{ if } C5_{i-1}+b' < P \quad (16)$$

Equation (16) above corresponds to the first arrangement of the control circuit 130B, and the interior division ratios of the two parallel interpolators 123, and 124 of the initial stage are respectively as follows:

$$C5_i : P-C5_i$$

$$C5_i+1 : P-(C5_i+1)$$

Equation (15) above corresponds to the second arrangement of the control circuit 130B, and the interior division ratio of the interpolator 125 of the second stage is as follows:

$$C4_i : M-C4_i$$

Accordingly, the output period of the phase adjusting circuit 120B [the period of the i-th signal and (i−1)th signal] is expressed by Equations (17) below. In these equations, aP, (a+1)P, bM and PM represent a×P, (a+1)×P, b×M and P×M, respectively, and "·" represents multiplication "×".

If $C4_{i-1}+K \geq M$, $C5_{i-1}+b' \geq P$ hold, then (a+1) becomes a and b+1 becomes b when the MOD ( ) operation is restored to the usual operation. Therefore, we have:

$$\{(a+1)P+(C5_i/P)P+(C4_i/PM)P\}-\{(C5_{i-1}/P)P+(C4_{i-1}/PM)P\}=\{(a+1)P+(MOD(C5_{i-1}+b+1,P)/P)P+(MOD(C4_{i-1}+K,M)/PM)P\}-\{(C5_{i-1}/P)P+(C4_{i-1}/PM)P\}=aP+P\cdot(C5_{i-1}+b)/P+P\cdot(C4_{i-1}+K/PM)-\{(C5_{i-1}/P)P+(C4_{i-1}/PM)P\}=aP+b+K/M \quad (17)$$

If $C4_{i-1}+K \geq M$, $C5_{i-1}+b' < P$ hold, then (b+1) becomes b when MOD ( ) is restored to the normal dividing operation.

Therefore, the output period of the phase adjusting circuit 120B [the period of the i-th signal and (i−1)th signal] is expressed by Equation (18) below.

$$\{aP+(C5_i/P)P+(C4_i/PM)P\}-\{(C5_{i-1}/P)P+(C4_{i-1}/PM)P\}=\{aP+(MOD(C5_{i-1}+b+1,P)/P)P+(MOD(C4_{i-1}+K,M)/PM)P\}-\{(C5_{i-1}/P)P+(C4_{i-1}/PM)P\}=aP+P\cdot(C5_{i-1}+b)/P++P\cdot(C4_{i-1}+K/PM)-\{(C5_{i-1}/P)P+(C4_{i-1}P/M)P\}=aP+b+K/M \quad (18)$$

If $C4_{i-1}+K < M$, $C5_{i-1}+b' \geq P$ hold, then a+1 becomes a when MOD ( ) is restored to the normal dividing operation. Therefore, the output period of the phase adjusting circuit 120B [the period of the ith signal and (i+1)th signal] is expressed by Equation (19) below.

$$\{(a+1)P+(C5_i/P)P+(C4_i/PM)P\}-\{(C5_{i-1}/P)P+(C4_{i-1}/PM)P\}=\{(a+1)P+(MOD(C5_{i-1}+b,P)/P)P+(MOD(C4_{i-1}+K,M)/PM)P\}-\{(C5_{i-1}/P)P+(C4_{i-1}/PM)P\}=aP+P\cdot(C5_{i-1}+b)/P+P\cdot(C4_{i-1}+K/PM)-\{(C5_{i-1}/P)P+(C4_{i-1}/M)P\}=aP+b+K/M \quad (19)$$

If $C4_{i-1}+K < M$, $C5_{i-1}+b' < P$ hold, then the output period of the phase adjusting circuit 120B [the period of the i-th signal and (i−1)th signal] is expressed by Equation (20) below.

$$\{aP+(C5_i/P)P+(C4_i/PM)P\}-\{(C5_{i-1}/P)P+(C4_{i-1}/PM)P\}=\{aP+(MOD(C5_{i-1}+b,P)/P)P+(MOD(C4_{i-1}+K,M)/PM)P\}-\{(C5_{i-1}/P)P+(C4_{i-1}/PM)P\}=aP+P\cdot(C5_{i-1}+b)/P+P\cdot(C4_{i-1}+K/PM)-\{(C5_{i-1}/P)P+(C4_{i-1}P/M)P\}=aP+b+K/M \quad (20)$$

Thus, in all combinations, the output period of the phase adjusting circuit 120B is a×P+b+K/M and any fractional frequency-dividing factor can be realized.

In this case, the output period of the prescaler 107 is equally divided by PM in the interpolator. An interpolator of the kind shown in FIGS. 5 to 7, for example, is utilizable as the interpolator in this arrangement. However, as long as the interior division ratio can be implemented accurately, another circuit arrangement may be adopted for the interpolator.

Figure 13:
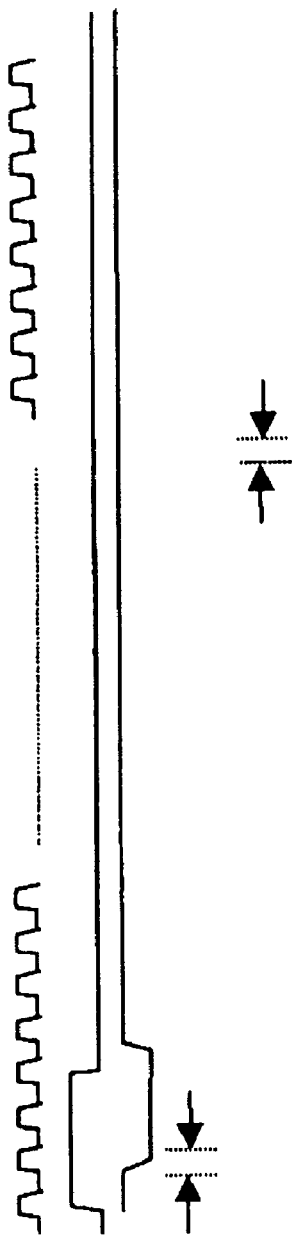
FIG. 13 is a diagram useful in describing an operation for controlling the interpolator according to the embodiments.

The timing of the operation performed by the control circuit 130 that sets the interior division ratio of the interpolator in each of the foregoing embodiments will now be described. In the interval over which the high-speed divided output of the prescaler 107 is divided by A in the A counter 109 [namely the A×P interval in which the period (1/fvco) of the output clock of VCO 106 serves as the unit], the interpolator is operated only over the interval of one period of the P-frequency-divided output; the interpolator does not operate in the remaining interval. Accordingly, in each of the above-described embodiments, the control circuit may be operated in any cycle in which the interpolator does not perform interpolation, as shown in FIG. 13. When the timing control signal WIE is output from the control circuit 130 (see FIG. 10, etc.) and attains HIGH level in FIG. 13, the P-frequency-divided output of the prescaler 107 (see FIG. 10) are fed to the clock input terminals of the D-type flip-flops 121 and 122 upon passing through the AND gate 131, and the phase difference between the two signals output from the data output terminals of the D-type flip-flops 121 and 122 is interpolated and output by the interpolator 123. This is the operating interval of the interpolator 123. During the divide-by-a cycle of the A counter 109, the control circuit 130 (see FIG. 10) operates at any timing other than in the operating interval of the interpolator 123, and the control signal that decides the interior division ratio of the next interpolation operation is output to the interpolator 123.

In accordance with the embodiments of the present invention having the structure set forth above, the frequency dividing circuit 107 is obtained by cascade-connecting a plurality of simple toggle circuits and the interior division of the output thereof is performed, thereby providing an operation equivalent to that of the conventional modulus control prescaler.

Further, the arrangement is such that the interpolator 123 (and interpolators 124 and 125) and control circuit 130 (130A and 130B) operate only one time in the interval over which the high-speed divided output of the prescaler 107 is divided by A in the A counter 109. This reduces power consumption.

The prescaler 107 is constructed by cascade-connecting toggle circuits. In comparison with the conventional modulus control prescaler, the number of circuit elements is reduced and operation is possible at high speed and with little consumption of power.

Further, in the embodiments of the present invention, fractional division can be achieved in the same operating cycle as integral division by adjusting the interior division ratio of the interpolator.

Though the present invention has been described in accordance with the foregoing embodiments, the invention is not limited to these embodiments and it goes without saying that the invention covers various modifications and changes that would be obvious to those skilled in the art within the scope of the claims.

The meritorious effects of the present invention are summarized as follows.

Thus, in accordance with the present invention as described above, there are provided a first frequency dividing circuit, a second frequency dividing circuit for dividing the P-frequency-divided output of the first frequency dividing circuit by A, and an interpolator for outputting a signal having a phase obtained by an interior division of a phase equivalent to one period of the P-frequency-divided output by a fraction whenever division by A is performed, thereby implementing integral frequency division A×P+B and fractional frequency division A×P+B+K/M. The number of high-speed circuit elements and power consumption are reduced in comparison with the conventional arrangement having two dividing (divide-by-P and divide-by-P+1) prescalers and two counters. Further, in accordance with the present invention, a single programmable counter suffices, thereby reducing power consumption.

In accordance with the present invention, the arrangement is such that the interpolator and control circuit operate only one time in the interval over which the P-frequency-divided output of the first frequency dividing circuit is divided by A.

In accordance with the present invention, control is simplified because there is no longer need for a modulus control signal for changing the frequency-dividing factor of a P/P+1 prescaler. The prescaler and control circuit 130A can be constructed on separate chips, thereby increasing freedom of design.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A variable frequency dividing circuit comprising:

a first frequency dividing circuit receiving an input signal, for performing frequency-division of the input signal by a first value P, where P is a positive integer;

a second frequency dividing circuit receiving the P-frequency-divided output signal of said first frequency dividing circuit, for performing frequency-division of the P-frequency-divided output signal by a second value A, where A is a positive integer;

a circuit for generating and outputting two signals having a phase difference equivalent to one period of the P-frequency-divided output signal of said first frequency dividing circuit, whenever frequency-divided by A is performed by said second frequency dividing circuit;

an interpolator receiving the two signals, for generating and outputting an output signal of a phase obtained by interpolating a phase difference between said two signals in accordance with a interior division ratio set by a control signal applied thereto;

said interpolator adopting P as the dividing number of the phase difference and producing an output signal, the phase of which is a predetermined multiple of a unit obtained by dividing the phase difference equivalent to one period of the P-frequency-divided output of said first frequency dividing circuit by P in accordance with the interior division ratio; and;

means for incrementing or decrementing the interior division ratio of said interpolator, whenever the frequency-division by A is performed by said second frequency dividing circuit, by B times the unit obtained by dividing the phase difference equivalent to one period of the P-frequency-divided output of said first frequency dividing circuit by P where B is a positive integer that is less than P;

said interpolator producing an output signal obtained by performing frequency-division of the input signal by a frequency-dividing factor A×P+B.

2. The variable frequency dividing circuit according to claim 1, further comprising:

an arithmetic circuit for adding a value B to a preceding value C1 of an internal division ratio C1:P−C1 of said interpolator whenever frequency-division by A is performed by said second frequency dividing circuit, and outputting a remainder obtained by dividing the result of the addition by P; and a control circuit for performing control to set the remainder, which is output from said arithmetic circuit, to the value C1 of the interior division ratio of said interpolator, and to add 1 to the frequency dividing factor A of said second frequency dividing circuit when the result of adding B to the preceding value C1 of the interior division ratio is equal to or greater than P, thereby performing frequency-division by A+1.

3. A variable frequency dividing circuit comprising:

a first frequency dividing circuit receiving an input signal, for performing frequency-division of the input signal by a first value P, where P is a positive integer;

a second frequency dividing circuit receiving the P-frequency-divided output of said first frequency dividing circuit for performing frequency-division of the P-frequency-divided output by a second value A where A is a positive integer;

a circuit for generating and outputting two signals having a phase difference equivalent to one period of the P-frequency-divided output of said first frequency dividing circuit, whenever frequency-division by A is performed by said second frequency dividing circuit;

an interpolator receiving said two signal, for generating and outputting an output signal of a phase obtained by interpolating the phase difference between the two input signals in accordance with an interior division ratio set by a control signal applied thereto;

said interpolator adopting P×M, where M is a predetermined positive integer, as the dividing number of the phase difference and producing an output signal, the phase of which is a predetermined multiple of a unit obtained by dividing the phase difference equivalent to one period of the P-frequency-divided output of said first frequency dividing circuit by P×M; and a control circuit for performing control in such a manner that a fixed value B×M+K, where K is a predetermined positive integer that is less than M, is added to a preceding value C1 of an interior division ratio C1:P−C1 of said interpolator whenever frequency-division by A is performed by said second frequency dividing circuit, a remainder obtained by dividing the result of addition by P×M is adopted as the present value C1 of the interior division ratio of said interpolator, and 1 is added to the frequency-dividing factor of said second frequency dividing circuit to perform frequency-division by A+1 if the value obtained by adding the constant value B×M+K to the preceding value C1 of the interior division ratio of said interpolator is equal to or greater than P×M;

said interpolator producing and outputting an output signal obtained by performing frequency-division of the input signal by a frequency-dividing factor A×P+B+K/M.

4. The variable frequency dividing circuit according to claim 3, wherein said interpolator comprises:

first and second interpolators, each receiving said two signals, each for generating an output signal of a phase obtained by interpolating the phase difference between the two signals in accordance with respective ones of interior division ratios set by a control signal applied thereto; and a third interpolator receiving the signals output from said first and second interpolators, for generating an output signal of a phase obtained by interpolating the phase difference between the signals output from said first and second interpolators.

5. A variable frequency dividing circuit comprising:

a first frequency dividing circuit receiving an input signal, for performing frequency-division of the input signal by a first value P, where P is a positive integer;

a second frequency dividing circuit receiving the P-frequency-divided output of said first frequency dividing circuit, for performing frequency-division of the P-frequency-divided output by a second value A, where A is a positive integer;

a circuit for generating and outputting two signals having a phase difference equivalent to one period of the P-frequency-divided output of said first frequency dividing circuit, whenever frequency-division by A is performed by said second frequency dividing circuit;

first and second interpolators, each receiving said two signals, each for generating an output signal of a phase obtained by interpolating the phase difference between said two signals in accordance with respective ones of interior division ratios set by a control signal applied thereto; and a third interpolator, receiving the signals output from said first and second interpolators, for generating an output signal of a phase obtained by interpolating the phase difference between the two signals output from said first and second interpolators;

said first interpolator interpolating phase in accordance with an interior division ratio C2:P−C2 in steps of a value obtained by dividing the phase difference between the two signals fed to said first interpolator by P;

said second interpolator interpolating phase in accordance with an interior division ratio C2+1:P−(C2+1) in steps of a value obtained by dividing the phase difference between the two signals fed to said second interpolator by P; and said third interpolator interpolating phase in accordance with an interior division ratio C3:M−C3 in steps of a value obtained by dividing the phase difference between the two signals output from the first and second interpolators, by M, where M is a predetermined positive integer;

C1:P×M−C1 being adopted as the total interior division ratio of said first to third interpolators;

said variable frequency dividing circuit further comprising a control circuit for performing control in such a manner that a fixed value B×M+K, where K is a predetermined positive integer being less than M, is added to a preceding value C1 of the total interior division ratio C1:P−C1 whenever frequency-division by A is performed by said second frequency dividing circuit, a remainder obtained by dividing the result of addition by P×M is adopted as the present value C1 of the total interior division ratio, and 1 is added to the frequency-dividing factor of said second frequency dividing circuit to perform frequency-division by A+1 if the value obtained by adding the constant value B×M+K to the preceding value C1 of the total interior division ratio is equal to or greater than P×M;

wherein the value C2 of the interior division ratios of said first and second interpolators is an integral part obtained by dividing C1 by M;

C3 in said third interpolator is a remainder obtained by dividing C1 by M; and said third interpolator outputs a signal obtained by performing frequency-division of the input signal by a frequency-dividing factor A×P+B+K/M.

6. A variable frequency dividing circuit comprising:

a first frequency dividing circuit, receiving an input signal, for performing frequency-division of the input signal by a first value P, where P is a positive integer;

a second frequency dividing circuit receiving the P-frequency-divided output of said first frequency dividing circuit for performing frequency-division of the P-frequency-divided output by a second value A, where A is a positive integer;

a circuit for generating two signals having a phase difference equivalent to one period of the P-frequency-divided output of said first frequency dividing circuit, whenever frequency-division by A is performed by said second frequency dividing circuit;

first and second interpolators, each receiving the two signal, each for generating an output signal of a phase obtained by interpolating the phase difference between the two signals in accordance with respective ones of interior division ratios set by a control signal applied thereto; and a third interpolator receiving the signals output from said first and second interpolators, for generating an output signal of a phase obtained by interpolating the phase difference between the two signals output from said first and second interpolators;

said first interpolator interpolating phase in accordance with an interior division ratio C5:P−C5 in steps of a value obtained by dividing the phase difference between the two signals fed to said first interpolator by P;

said second interpolator interpolating phase in accordance with an interior division ratio C5+1:P−(C5+1) in steps of a value obtained by dividing the phase difference between the two signals said second interpolator by P; and said third interpolator interpolating phase in accordance with an interior division ratio C4:M−C4 in steps of a value obtained by dividing the phase difference between the two signals output from the first and second interpolators, by M where M is a predetermined positive integer;

said variable frequency dividing circuit further comprising a control circuit for performing control so as to add a third value B, where B is a predetermined positive integer that is less than P, to preceding values C5, and C5+1 of the interior division ratios of said first and second interpolators whenever frequency-division by A is performed by said second frequency dividing circuit, adopt the remainders, which are obtained by dividing the results of addition by P, as the present values C5 and C5+1 of said first and second interpolators, respectively, add a fourth value K, where K is a predetermined positive integer that is less than M, to the preceding value C4 of the interior division ratio of said third interpolator whenever frequency-division by A is performed by said second frequency dividing circuit, and adopt the remainder, which is obtained by dividing the result of addition by M, as the present value C4 of said third interpolator;

said control circuit adding 1 to B if the value obtained by adding K to the preceding value C4 of the interior division ratio of said third interpolator is equal to or greater than M, and adding 1 to the frequency dividing factor A of said second frequency dividing circuit if the value obtained by adding B to the preceding value C5 is equal to or greater than P;

said third interpolator outputting a signal obtained by performing frequency-division of the input signal by a frequency-dividing factor A×P+B+K/M.

7. A PLL circuit comprising:

a phase comparator circuit having first and second input terminals for respectively receiving signals, and comparing a phase of the signal at the first input terminal and a phase of the signal at the second input terminal to output a phase difference signal, a reference clock signal being fed to said first input terminal;

a charge pump receiving the phase difference signal output from said phase comparator circuit, for generating a voltage conforming to the phase difference;

a loop filter for smoothing the voltage conforming to the phase difference;

a voltage-controlled oscillator receiving an output signal of said loop filter as a control signal, for outputting a clock signal having an oscillation frequency prescribed by the control signal;

a first frequency dividing circuit receiving the output clock signal of said voltage-controlled oscillator, for performing frequency-division of the clock signal by a first value P;

a second frequency dividing circuit receiving the P-frequency-divided output signal output from said first frequency dividing circuit, for performing frequency-division of the P-frequency-divided output signal by a second value A;

a circuit for generating two signals, having a phase difference equivalent to one period of the P-frequency-divided output of said first frequency dividing circuit, whenever frequency-division by A is performed by said second frequency dividing circuit; and an interpolator, receiving the two signals, for generating and outputting an output signal of a phase obtained by interpolating the phase difference between the two input signals in accordance with an interior division ratio set by a control signal applied thereto;

said interpolator adopting P as the dividing number of the phase difference;

said interpolator producing an output signal, the phase of which is a predetermined multiple of a unit obtained by dividing the phase difference equivalent to one period of the P-frequency-divided output of said first frequency dividing circuit by P in accordance with the interior division ratio;

said PLL further comprising means for incrementing or decrementing the interior division ratio of said interpolator, whenever frequency-division by A is performed by said second frequency dividing circuit, by B times the unit obtained by dividing the phase difference equivalent to one period of the P-frequency-divided output of said first frequency dividing circuit by P, where B is a positive integer that is less than P;

the output signal of said interpolator being fed to the second input terminal of said phase comparator circuit.

8. The PLL circuit according to claim 7, further comprising:

an arithmetic circuit for adding B to a preceding value C1 of an interior division ratio C1:P−C1 of said interpolator whenever frequency-division by A is performed by said second frequency dividing circuit, and outputting a remainder obtained by dividing the result of addition by P; and a control circuit for performing control to set the remainder, which is output from said arithmetic circuit, to the value C1 of the interior division ratio of said interpolator, and to add 1 to the frequency dividing factor A of said second frequency dividing circuit when the result of adding B to the preceding value C1 of the interior division ratio is equal to or greater than P, thereby performing frequency-division by A+1.

9. A PLL circuit comprising:

a phase comparator circuit, having first and second input terminals for respectively receiving signals, and comparing a phase of the signal at the first input terminal and a phase of the signal at the second input terminal to output a phase difference signal, a reference clock signal being fed to said first input terminal;

a charge pump receiving the phase difference signal output from said phase comparator circuit, for generating a voltage conforming to the phase difference;

a loop filter for smoothing the voltage conforming to the phase difference;
a voltage-controlled oscillator receiving an output signal of said loop filter as a control signal, for outputting a clock signal having an oscillation frequency prescribed by the control signal;
a first frequency dividing circuit receiving the output clock signal of said voltage-controlled oscillator, for performing frequency-division of the clock signal by a first value P;
a second frequency dividing circuit receiving the P-frequency-divided output signal output from said first frequency dividing circuit, for performing frequency-division of the P-frequency-divided output signal by a second value A;
a circuit for generating two signals, having a phase difference equivalent to one period of the P-frequency-divided output of said first frequency dividing circuit, whenever frequency-division by A is performed by said second frequency dividing circuit; and
an interpolator, receiving the two generated signals, for generating and outputting an output signal of a phase obtained by interpolating the phase difference between the two input signals in accordance with an interior division ratio set by a control signal applied thereto;
said PLL circuit further comprising a control circuit for performing control in such a manner that a fixed value B×M+K, where K is a predetermined positive integer that is less than M, is added to a preceding value C1 of an interior division ratio C1:P−C1 of said interpolator, every frequency-division by A, at which the interpolator performs an interpolating operation, a remainder obtained by dividing the result of addition by P×M is adopted as the present value C1 of the interior division ratio of said interpolator, and 1 is added to the frequency-dividing factor of said second frequency dividing circuit to perform frequency-division by A+1 if the value obtained by adding the constant value B×M+K to the preceding value C1 of the interior division ratio of said interpolator is equal to or greater than P×M;
the output signal of said interpolator being fed to the second input terminal of said phase comparator circuit.

10. A PLL circuit comprising:
a phase comparator circuit having first and second input terminals for respectively receiving signals, and comparing a phase of the signal at the first input terminal and a phase of the signal at the second input terminal to output a phase difference signal, a reference clock signal being fed to said first input terminal;
a charge pump receiving the phase difference signal output from said phase comparator circuit, for generating a voltage conforming to the phase difference;
a loop filter for smoothing the voltage conforming to the phase difference;
a voltage-controlled oscillator receiving an output of said loop filter is input as a control signal, for outputting a clock having an oscillation frequency prescribed by the control signal;
a first frequency dividing circuit receiving the output clock of said voltage-controlled oscillator, for performing frequency-division of the clock signal by a first value P;
a second frequency dividing circuit receiving the P-frequency-divided output signal output from said first frequency dividing circuit, for performing frequency-division of the P-frequency-divided output signal by a second value A;

a circuit for generating two signals, having a phase difference equivalent to one period of the P-frequency-divided output of said first frequency dividing circuit, whenever frequency-division by A is performed by said second frequency dividing circuit;
first and second interpolators, receiving the two generated signals each for generating an output signal of a phase obtained by interpolating the phase difference between the two signals in accordance with respective ones of interior division ratios set by a control signal applied thereto; and
a third interpolator, receiving the signals output from said first and second interpolators, for generating an output signal of a phase obtained by interpolating the phase difference between the two signals output from said first and second interpolators;
said first interpolator interpolating phase in accordance with an interior division ratio C2:P−C2 in steps of a value obtained by dividing the phase difference between the two input signals by P;
said second interpolator interpolating phase in accordance with an interior division ratio C2+1:P−(C2+1) in steps of a value obtained by dividing the phase difference between the two input signals by P; and
said third interpolator interpolating phase in accordance with an interior division ratio C3:M−C3 in steps of a value obtained by dividing the phase difference between the two input signals by M where M is a predetermined positive integer;
C1:P×M−C1 being adopted as the total interior division ratio of said first to third interpolators;
said PLL circuit further comprising a control circuit for performing control in such a manner that a fixed value B×M+K, where K is a predetermined positive integer that is less than M, is added to a preceding value C1 of the total interior division ratio C1:P−C1 whenever frequency-division by A is performed by said second frequency dividing circuit, a remainder obtained by dividing the result of addition by P×M is adopted as the present value C1 of the total interior division ratio, and 1 is added to the frequency-dividing factor of said second frequency dividing circuit to perform frequency-division by A+1 if the value obtained by adding the constant value B×M+K to the preceding value C1 of the total interior division ratio is equal to or greater than P×M;
wherein the value C2 of the interior division ratios of said first and second interpolators is an integral part obtained by dividing C1 by M;
C3 in said third interpolator is a remainder obtained by dividing C1 by M; and
the output signal of said third interpolator is fed to the second input terminal of said phase comparator circuit.

11. A PLL circuit comprising:
a phase comparator circuit having first and second input terminals for respectively receiving signals, and comparing a phase of the signal at the first input terminal and a phase of the signal at the second input terminal to output a phase difference signal, a reference clock signal being fed to said first input terminal;
a charge pump receiving the phase difference signal output from said phase comparator circuit, for generating a voltage conforming to the phase difference;
a loop filter for smoothing the voltage conforming to the phase difference;

a voltage-controlled oscillator receiving an output signal of said loop filter as a control signal, for outputting a clock having an oscillation frequency prescribed by the control signal;

a first frequency dividing circuit receiving the output clock of said voltage-controlled oscillator, for performing frequency-division of the clock signal by a first value P;

a second frequency dividing circuit receiving P-frequency-divided output signal output from said first frequency dividing circuit, for performing frequency-division of the P-frequency-divided output signal by a second value A;

a circuit for generating two signals, having a phase difference equivalent to one period of the P-frequency-divided output of said first frequency dividing circuit, whenever frequency-division by A is performed by said second frequency dividing circuit;

first and second interpolators, each receiving two generated signals, each for generating an output signal of a phase obtained by interpolating the phase difference between the two signals in accordance with respective ones of interior division ratios set by a control signal applied thereto; and a third interpolator receiving the signals output from said first and second interpolators, for generating an output signal of a phase obtained by interpolating the phase difference between the two signals output from said first and second interpolators;

said first interpolator interpolating phase in accordance with an interior division ratio C5:P−C5 in steps of a value obtained by dividing the phase difference between the two input signals by P;

said second interpolator interpolating phase in accordance with an interior division ratio C5+1:P−(C5+1) in steps of a value obtained by dividing the phase difference between the two input signals by P; and said third interpolator interpolating phase in accordance with an interior division ratio C4:M−C4 in steps of a value obtained by dividing the phase difference between the two signals, which are output from the first and second interpolators, by M, where M is a predetermined positive integer;

said PLL circuit further comprising a control circuit for performing control so as to add a third value B, where B is a predetermined positive integer that is less than P, to preceding values C5, C5+1 of the interior division ratios of said first and second interpolators whenever frequency-division by A is performed by said second frequency dividing circuit, adopt the remainders, which are obtained by dividing the results of addition by P, as the present values C5, C5+1 of said first and second interpolators, respectively, add a fourth value K where K is a predetermined positive integer that is less than M, to the preceding value C4 of the interior division ratio of said third interpolator whenever frequency-division by A is performed by said second frequency dividing circuit, and adopt the remainder, which is obtained by dividing the result of addition by M, as the present value C4 of said third interpolator;

said control circuit adding 1 to B if the value obtained by adding K to the preceding value C4 of the interior division ratio of said third interpolator is equal to or greater than M, and adding 1 to the frequency dividing factor A of said second frequency dividing circuit if the value obtained by adding B to the preceding value C5 is equal to or greater than P;

the output signal of said third interpolator being fed to the second input terminal of said phase comparator circuit.

12. The PLL circuit according to claim 11, wherein said control circuit comprises a first stage corresponding to said first and second interpolators and a second stage corresponding to said third interpolator;

the first stage of said control circuit controls division ratios C5: P−C5, C5+1:P−(C5+1) of said first and second interpolators, respectively, and the second stage of said control circuit controls an interior division ratio C4:P−C4 of said third interpolator;

the present values C5, C5+1 of the interior division ratios of said first and second interpolators are adopted as remainders of P of a value obtained by adding B' to the preceding division ratios C5, C5+1; and control is performed in such a manner that:

B' is made B+1 when C4+K is equal to or greater than M;

B' is made B when C4+K is less than M; and the frequency-dividing factor of said second frequency dividing circuit is made A+1 when C5+B' is equal to or greater than P and is made A when C5+B' is less than P.

13. A PLL circuit comprising:

a phase comparator circuit having first and second input terminals for respectively receiving signals, and comparing a phase of the signal at the first input terminal and a phase of the signal at the second input terminal to output a phase difference signal, a reference clock signal being fed to said first input terminal;

a charge pump receiving the phase difference signal output from said phase comparator circuit, for generating a voltage conforming to the phase difference;

a loop filter for smoothing the voltage conforming to the phase difference;

a voltage-controlled oscillator receiving an output signal of said loop filter as a control signal, for outputting a clock signal having an oscillation frequency prescribed by the control signal;

a first frequency dividing circuit receiving the output clock signal of said voltage-controlled oscillator, for performing frequency-division of the clock signal by a first value P;

a second frequency dividing circuit receiving the P-frequency-divided output signal output from said first frequency dividing circuit, for performing frequency-division of the P-frequency-divided output signal by a second value A;

an interpolator an output phase whereof is freely variable by a control signal;

oscillation frequency fvco of said voltage-controlled oscillator being divided down to fvco/P by said first frequency dividing circuit and further divided by A down to (fvco/P)/A by said second frequency dividing circuit;

means for outputting a phase difference equivalent to the period fvco/P of said first frequency dividing circuit whenever frequency-division by A is performed by said second frequency dividing circuit;

said interpolator performing interpolation in steps of 1/P of the phase difference; and means for incrementing or decrementing an interior division ratio of said interpolator by a constant value whenever division by A is performed;

an output from said interpolator being fed to said phase comparator circuit for being compared with the reference signal;

whereby the oscillation frequency of said voltage-controlled oscillator is divided by A×P+B.

14. The PLL circuit according to claim 7, wherein the phase difference is interpolated in steps of 1/(P×M) by said interpolator;
the oscillation frequency of said voltage-controlled oscillator is fractionally divided by A×P+B+K/M; and
the fractionally divided output of said interpolator is input to said phase comparator circuit for being compared with the reference signal;
whereby the oscillation frequency of said voltage-controlled oscillator is divided by A×P+B+K/M.

15. The variable frequency dividing circuit according to claim 1, wherein said interpolator comprises:
a logic circuit, which receives first and second input signals from respective ones of two input terminals, for outputting the result of a prescribed logic operation between the first and second input signals;
a first switch element, which is connected between a first power supply and an internal node and to a control terminal whereof an output signal from said logic circuit is input, for being turned on when both the first and second input signals are at a first logic value to thereby form a path that charges the internal node; and
a non-inverting or inverting buffer circuit having the internal node connected to an input terminal thereof for changing an output logic value if a size relationship between voltage at the internal node and a threshold value has been inverted;
a plurality of series circuits being connected in parallel between the internal node and the second power supply, each series circuit comprising a second switch element turned on when the first input signal is at a second logic value, and a third switch element turned on and off based upon the control signal that decides the interior division ratio of said interpolator;
a plurality of series circuits being connected in parallel between the internal node and the second power supply, each series circuit comprising a fourth switch element turned on when the second input signal is at a second logic value, and a fifth switch element turned on and off based upon the control signal.

16. The variable frequency dividing circuit according to claim 15, wherein said interpolator comprises a plurality of series circuits connected in parallel with each other between the internal node and the second power supply, each series circuit being composed of a switch element and a capacitance, and wherein the plurality of said switch elements are turned on or off by a control signal fed to control terminals of said plurality of switch elements to thereby decide a capacitance connected to the internal node.

17. The PLL circuit according to claim 7, wherein said interpolator comprises:
a logic circuit, which receives first and second input signals from respective ones of two input terminals, for outputting the result of a prescribed logic operation between the first and second input signals;
a first switch element, which is connected between a first power supply and an internal node and to a control terminal whereof an output signal from said logic circuit is input, for being turned on when both the first and second input signals are at a first logic value to thereby form a path that charges the internal node; and
a non-inverting or inverting buffer circuit having the internal node connected to an input terminal thereof for changing an output logic value if a size relationship between voltage at the internal node and a threshold value has been inverted;
a plurality of series circuits being connected in parallel between the internal node and the second power supply, each series circuit comprising a second switch element turned on when the first input signal is at a second logic value, and a third switch element turned on and off based upon the control signal that decides the interior division ratio of said interpolator;
a plurality of series circuits being connected in parallel between the internal node and the second power supply, each series circuit comprising a fourth switch element turned on when the second input signal is at a second logic value, and a fifth switch element turned on and off based upon the control signal.

18. The PLL circuit according to claim 17, wherein said interpolator comprises a plurality of series circuits, connected in parallel with each other between the internal node and the second power supply, each series circuit being composed of a switch element and capacitance, and wherein the plurality of said switch elements are turned on or off by a plurality of control signal applied to control terminals of said plurality of switch elements to thereby decide a capacitance connected to the internal node.

19. The variable frequency dividing circuit according to claim 1, wherein said first frequency dividing circuit comprises a prescaler that includes a plurality of cascade-connected D-type flip-flops.

20. The variable frequency dividing circuit according to claim 1, wherein said second frequency dividing circuit comprises a programmable counter for counting to the second value A or to a value A+1 obtained by adding 1 to the second value A.

21. The variable frequency dividing circuit according to claim 1, further comprising a circuit for controlling a gate in such a manner that the P-frequency-divided output of said first frequency dividing circuit is transmitted to an input terminal of a circuit that generates two signals having a phase difference equivalent to one period of the P-frequency-divided output of said first frequency dividing circuit whenever frequency-division by A is performed by said second frequency dividing circuit.

22. The PLL circuit according to claim 7, wherein said first frequency dividing circuit comprises a divide-by-P prescaler that includes a plurality of cascade-connected D-type flip-flops.

23. The PLL circuit according to claim 7, wherein said second frequency dividing circuit comprises a programmable counter for counting to the second value A or to a value A+1 obtained by adding 1 to the second value A.

24. The PLL circuit according to claim 7, further comprising a circuit for performing gating control in such a manner that the P-frequency-divided output of said first frequency dividing circuit is transmitted to an input terminal of a circuit that generates two signals having a phase difference equivalent to one period of the P-frequency-divided output of said first frequency dividing circuit whenever frequency-division by A is performed by said second frequency dividing circuit.

25. A clock control method comprising the steps of:
performing frequency-division of an input signal by a first value, P where P is a positive integer, by a first frequency dividing circuit;
performing frequency-division of the P-frequency-divided output signal of the first frequency dividing circuit by a second value A, where A is a positive integer, by a second frequency dividing circuit;

generating two signals, having a phase difference equivalent to one period of the P-frequency-divided output of the first frequency dividing circuit, whenever frequency-division by A is performed by the second frequency dividing circuit;

generating and outputting output signal having a phase obtained by interpolating the phase difference between the two signals by an interpolator, which receives the two signals, in steps of B/P, where B is a positive integer less than P, in accordance with an interior division ratio set by a control signal; and incrementing or decrementing the interior division ratio of the interpolator B/P at a time whenever division by A is performed;

the frequency of the input signal being divided by A×P+B.

26. The method according to claim 25, further comprising the steps of:

adding B, which decides C1 of an interior division ratio C1:P−C1 of the interpolator, to the preceding value of C1 of the interior division ratio whenever frequency-division by A is performed by the second frequency dividing circuit, and calculating a remainder obtained by dividing the result of addition by P;

setting the remainder to the value C1 of the interior division ratio of the interpolator; and performing control to add 1 to the frequency dividing factor A of the second frequency dividing circuit when the result of adding B to the preceding value C1 of the interior division ratio is equal to or greater than P, thereby performing division by A+1.

27. A clock control method comprising the steps of:

performing frequency-division of an input signal by a first value P, where P is a positive integer, by a first frequency dividing circuit;

performing frequency-division of the P-frequency-divided output signal of the first frequency dividing circuit by a second value A, where A is a positive integer, by a second frequency dividing circuit;

generating two signals, having a phase difference equivalent to one period of the P-frequency-divided output of the first frequency dividing circuit, whenever frequency-division by A is performed by the second frequency dividing circuit; and generating and outputting an output signal of a phase obtained by interpolating the phase difference between the two signals by an interpolator, which receives the two signals, in accordance with an interior division ratio set by a control signal input to said interpolator;

P×M, where M is a predetermined positive integer, being adopted as the dividing number of the phase difference;

said interpolator producing an output signal, the phase of which is a predetermined multiple of a unit obtained by dividing the phase difference equivalent to one period of the P-frequency-divided output of said first frequency dividing circuit by P×M;

said method further comprising steps of:

adding B×M+K, where K is a predetermined positive integer that is less than M, to a preceding value C1 of an interior division ratio C1:P−C1 of the interpolator every division by A at which the interpolator performs an interpolating operation, and adopting a remainder, which is obtained by dividing the result of addition by P×M, as the present value C1 of the interior division ratio of the interpolator; and performing control to add 1 to the frequency-dividing factor of said second frequency dividing circuit to perform frequency-division by A+1 if the value obtained by adding B×M+K to the preceding value C1 of the interior division ratio of the interpolator is equal to or greater than P×M;

said interpolator producing an output signal having a frequency-dividing factor A×P+B+K/M.

28. A clock control method comprising the steps of:

performing frequency-division of an input signal by a first value P, where P is a positive integer, by a first frequency dividing circuit;

performing frequency-division of the P-frequency-divided output signal of the first frequency dividing circuit by a second value A, where A is a positive integer, by a second frequency dividing circuit;

generating two signals, having a phase difference equivalent to one period of the P-frequency-divided output of the first frequency dividing circuit, whenever frequency-division by A is performed by the second frequency dividing circuit;

generating and outputting, by first and second interpolators, which receives the two generated signals, output signals of phases obtained by interpolating the phase difference between the two signals by said first and second interpolators in accordance with respective ones of interior division ratios set by a control signal fed to said first and second interpolators; and generating and outputting, by a third interpolator which receives the signals output from said first and second interpolators, an output signal of a phase obtained by interpolating the phase difference between the two signals;

said first interpolator interpolating phase in accordance with an interior division ratio C2:P−C2 in steps of a value obtained by dividing the phase difference between the two input signals by P;

said second interpolator interpolating phase in accordance with an interior division ratio C2+1:P−(C2+1) in steps of a value obtained by dividing the phase difference between the two input signals by P; and said third interpolator interpolating phase in accordance with an interior division ratio C3:M−C3 in steps of a value obtained by dividing the phase difference between the two signals output from the first and second interpolators, by M, where M is a predetermined positive integer;

C1:P×M−C1 being adopted as the total interior division ratio of said first to third interpolators;

further comprising the steps of:

adding B×M+K (where K is a predetermined positive integer that is less than M) to a preceding value C1 of the total interior division ratio C1:P−C1 whenever frequency-division by A is performed by said second frequency dividing circuit, and adopting a remainder, which is obtained by dividing the result of addition by P×M, as the present value C1 of the total interior division ratio; and performing control to add 1 to the frequency dividing factor of said second frequency dividing circuit to perform frequency-division by A+1 if the value obtained by adding B×M+K to the preceding value C1 of the total interior division ratio is equal to or greater than P×M;

wherein the value C2 of the interior division ratios of said first and second interpolators is an integral part obtained by dividing C1 by M;

C3 in said third interpolator is a remainder obtained by dividing C1 by M; and said third interpolator outputs a signal obtained by performing frequency-division of the input signal by a frequency-dividing factor A×P+B+K/M.

29. A clock control method comprising the steps of:

performing frequency-division of an input signal by a first value P, where P is a positive integer, by a first frequency dividing circuit;

dividing the P-frequency-divided output of the first frequency dividing circuit by a second value A, where A is a positive integer, by a second frequency dividing circuit;

generating two signals, having a phase difference equivalent to one period of the P-frequency-divided output of the first frequency dividing circuit, whenever frequency-division by A is performed by the second frequency dividing circuit;

generating and outputting, by first and second interpolators which receives the two generated signals, output signals of phases obtained by interpolating the phase difference between the two signals by said first and second interpolators in accordance with respective ones of interior division ratios set by a control signal supplied to said first and second interpolators; and generating and outputting, by a third interpolator which receives the signals output from said first and second interpolators, an output signal of a phase obtained by interpolating the phase difference between the two signals;

said first interpolator interpolating phase in accordance with an interior division ratio C5:P−C5 in steps of a value obtained by dividing the phase difference between the two input signals by P;

said second interpolator interpolating phase in accordance with an interior division ratio C5+1:P−(C5+1) in steps of a value obtained by dividing the phase difference between the two input signals by P; and said third interpolator interpolating phase in accordance with an interior division ratio C4:M−C4 in steps of a value obtained by dividing the phase difference between the two signals, which are output from the first and second interpolators, by M, where M is a predetermined positive integer;

further comprising the steps of:

adding a third value B, where B is a predetermined positive integer that is less than P, to preceding values C5, C5+1 of the interior division ratios of the first and second interpolators whenever frequency-division by A is performed by the second frequency dividing circuit, and adopting the remainders, which are obtained by dividing the results of addition by P, as the present values C5, C5+1 of the first and second interpolators, respectively;

adding a fourth value K, where K is a predetermined positive integer that is less than M, to the preceding value C4 of the interior division ratio of the third interpolator whenever frequency-division by A is performed by the second frequency dividing circuit, and adopting the remainder, which is obtained by dividing the result of addition by M, as the present value C4 of the third interpolator; and adding 1 to B if the value obtained by adding K to the preceding value C4 is equal to or greater than M, and adding 1 to the frequency dividing factor A of the second frequency dividing circuit if the value obtained by adding B to the preceding value C5 is equal to or greater than P;

said third interpolator outputting a signal obtained by performing frequency-division of the input signal by a frequency-dividing factor A×P+B+K/M.

* * * * *